(12) United States Patent
Hata et al.

(10) Patent No.: US 9,126,835 B2
(45) Date of Patent: Sep. 8, 2015

(54) CARBON NANOTUBE FILM STRUCTURE AND METHOD FOR MANUFACTURING THE SAME

(71) Applicant: NATIONAL INSTITUTE OF ADVANCED INDUSTRIAL SCIENCE AND TECHNOLOGY, Tokyo (JP)

(72) Inventors: Kenji Hata, Ibaraki (JP); Yuuhei Hayamizu, Ibaraki (JP); Takeo Yamada, Ibaraki (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 14/095,049

(22) Filed: Dec. 3, 2013

(65) Prior Publication Data

US 2014/0093694 A1 Apr. 3, 2014

Related U.S. Application Data

(63) Continuation of application No. 12/919,907, filed as application No. PCT/JP2009/053907 on Mar. 2, 2009, now Pat. No. 8,623,495.

(30) Foreign Application Priority Data

Feb. 29, 2008 (JP) ................................ 2008-051319
May 1, 2008 (JP) ................................ 2008-119820

(51) Int. Cl.
*B32B 3/00* (2006.01)
*B32B 9/00* (2006.01)
(Continued)

(52) U.S. Cl.
CPC ............. *C01B 31/022* (2013.01); *B81C 1/0038* (2013.01); *B82Y 30/00* (2013.01);
(Continued)

(58) Field of Classification Search
CPC ...... B81C 1/0038; B82Y 30/00; B82Y 40/00; B81B 2203/0127; C01B 31/022; C01B 2202/08; C01B 2202/10; Y10T 428/24612; Y10T 428/24521; Y10T 428/24851; Y10T 428/24479; Y10T 428/30; Y10T 428/249924; Y10T 156/1028; Y10T 156/1041
USPC .......................... 428/161, 408, 156; 977/742
See application file for complete search history.

(56) References Cited

U.S. PATENT DOCUMENTS

2005/0260453 A1 11/2005 Jiao et al.

FOREIGN PATENT DOCUMENTS

| JP | 2003-081622 | 3/2003 |
|---|---|---|
| JP | 2005-100757 | 4/2005 |
| JP | 2008-230957 | 10/2008 |

OTHER PUBLICATIONS

International Search Report issued Jun. 2, 2009 in International (PCT) Application No. PCT/JP2009/053907.

(Continued)

*Primary Examiner* — Catherine A Simone
(74) *Attorney, Agent, or Firm* — Wenderoth, Lind & Ponack, L.L.P.

(57) ABSTRACT

A method of producing a carbon nanotube film structure having a substrate and a carbon nanotube layer, comprises a placing step of placing a carbon nanotube film comprising a plurality of carbon nanotubes aligned in one direction within a film plane on the substrate; and a densifying step of applying a densifying treatment to the carbon nanotube film thereby forming the carbon nanotube layer having the weight density of the carbon nanotube to 0.1 g/cm³ or more. Thus, a problem of island-like shrinkage caused while a highly densified CNT layer is being manufactured is solved, and a high-quality CNT film structure wherein the aligned CNT layer having a high density and uniform thickness is deposited on the substrate.

7 Claims, 28 Drawing Sheets

(51) Int. Cl.
*C01B 31/02* (2006.01)
*B81C 1/00* (2006.01)
*B82Y 30/00* (2011.01)
*B82Y 40/00* (2011.01)

(52) U.S. Cl.
CPC ........ *B82Y 40/00* (2013.01); *B81B 2203/0127* (2013.01); *C01B 2202/08* (2013.01); *C01B 2202/10* (2013.01); *Y10T 156/1028* (2015.01); *Y10T 156/1041* (2015.01); *Y10T 428/24479* (2015.01); *Y10T 428/24521* (2015.01); *Y10T 428/24612* (2015.01); *Y10T 428/24851* (2015.01); *Y10T 428/249924* (2015.04); *Y10T 428/30* (2015.01)

(56) References Cited

OTHER PUBLICATIONS

"Haiko Carbon Nanotube Kiban o Mochiita Shuseiki Sanjigen MEMS Device no Sosei I", Abstracts of the Meeting of the Physical Society of Japan, (Feb. 29, 2008), vol. 63, No. 1, p. 800.

Fig.2
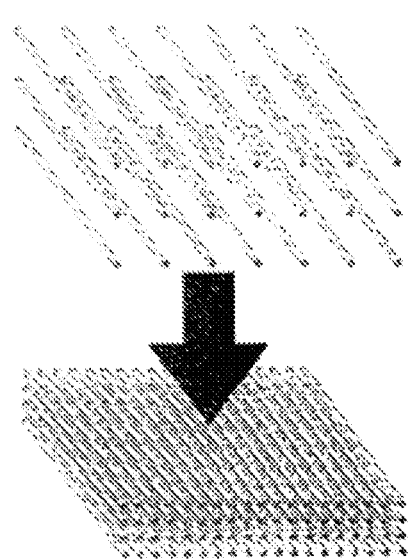
(b)
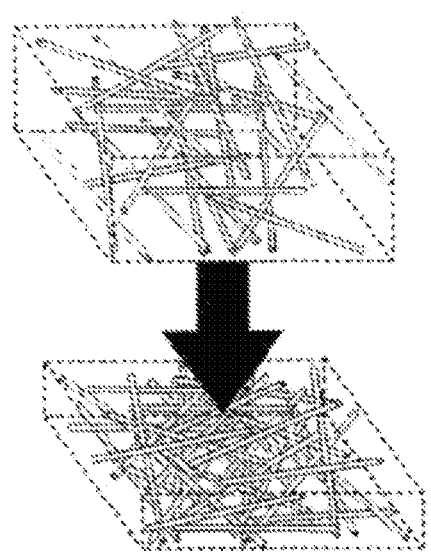
(a)

Fig.3
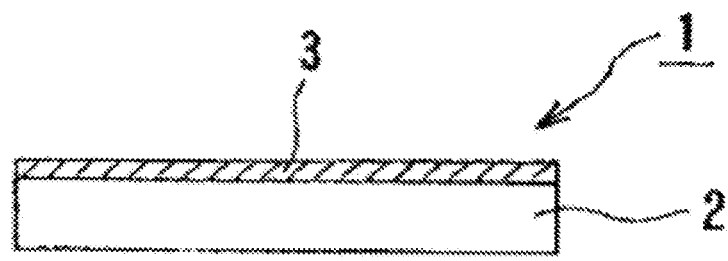
Fig.4
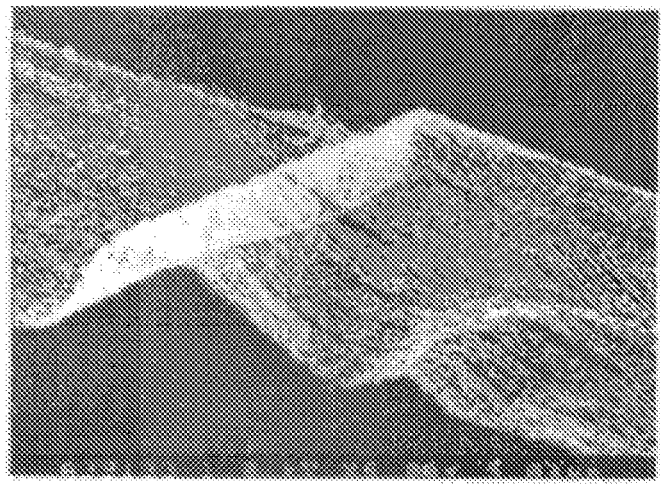
(a)
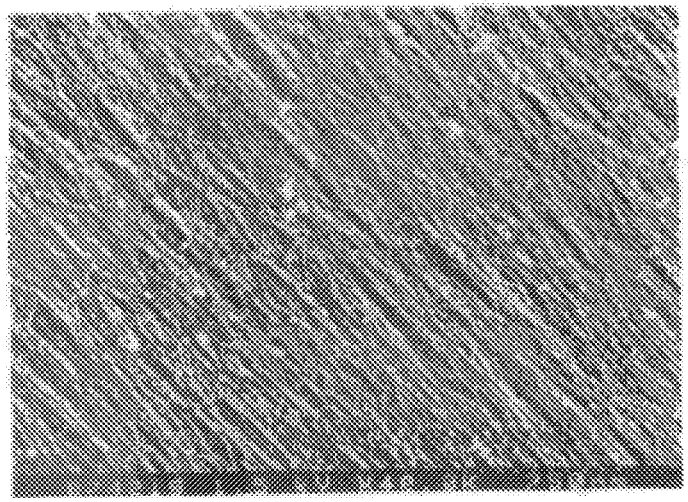
(b)

Fig.10
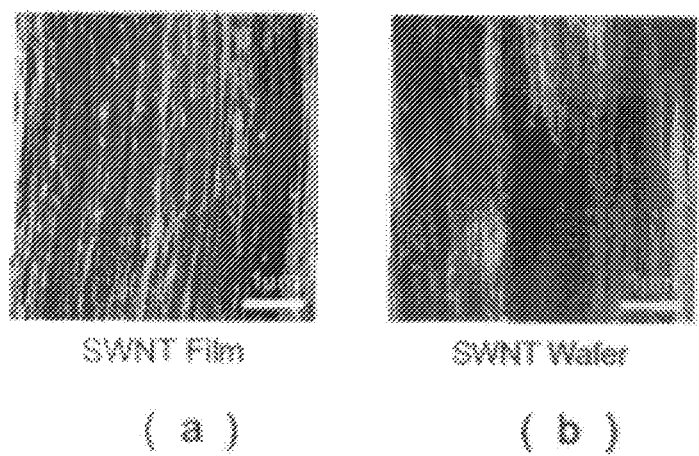
(a) SWNT Film  (b) SWNT Wafer
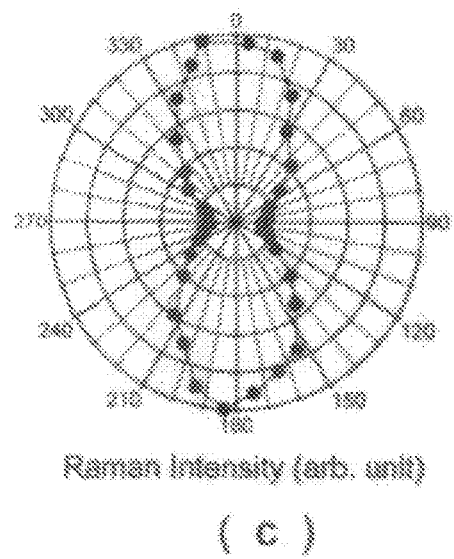
Raman Intensity (arb. unit)
(c)

Fig.14
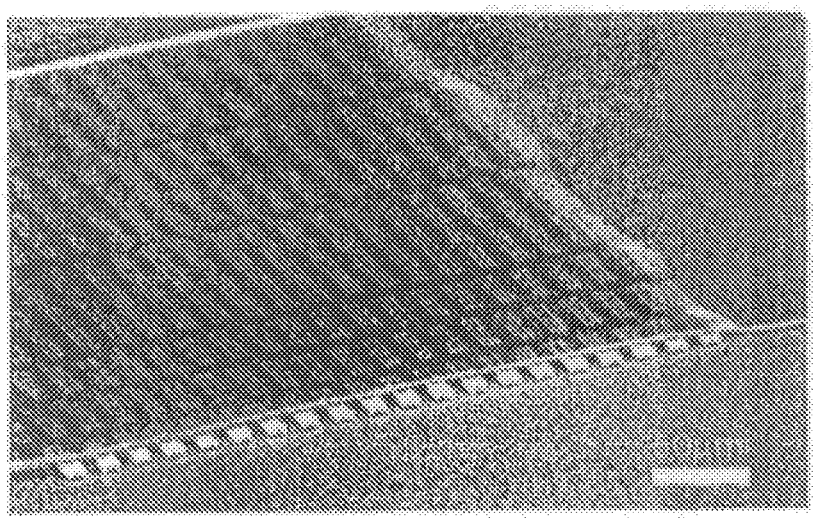
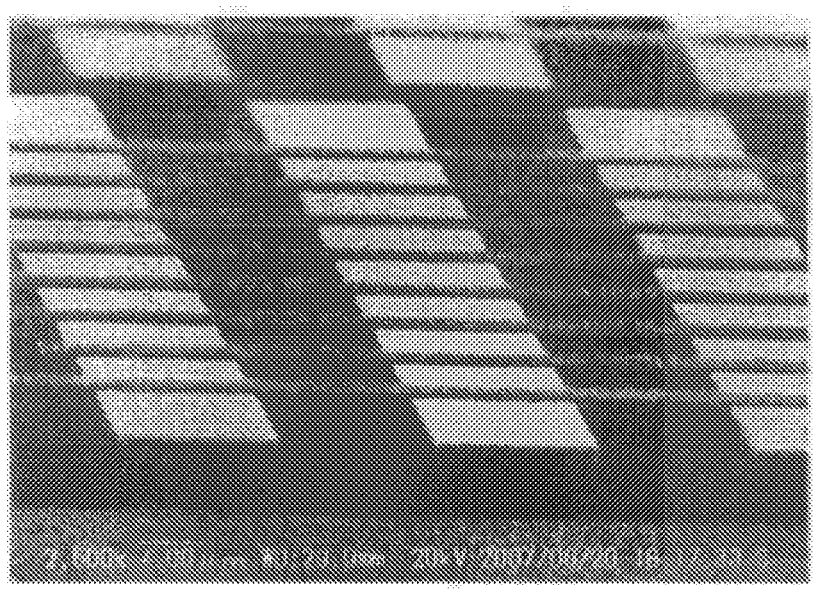

Fig. 16
(a)
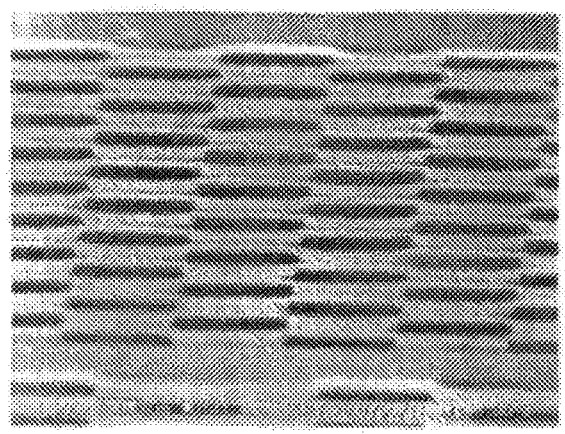
(b)
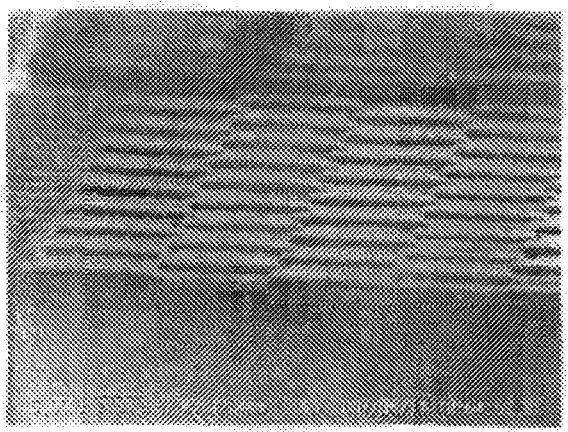

Fig.17
(a)
(b)

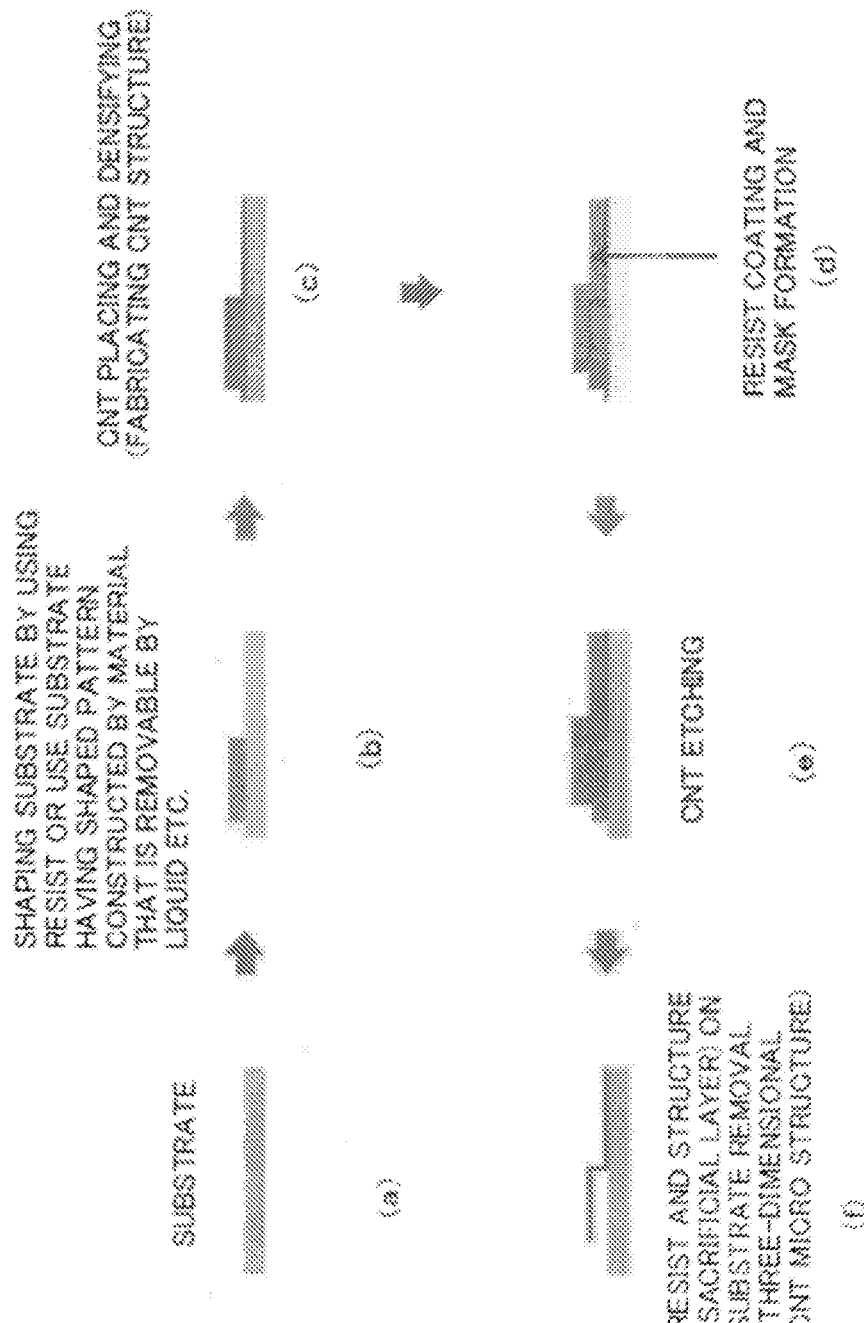

CARBON NANOTUBE FILM STRUCTURE AND METHOD FOR MANUFACTURING THE SAME

FIELD OF THE INVENTION

The present invention relates to a carbon nanotube film structure, and a production process thereof. More specifically the invention also relates to a carbon nanotube film structure in which a carbon nanotube layer formed by aligning a plurality of carbon nanotubes continuously in one direction within a film plane is deposited on a substrate, and a production process thereof. Further, the invention also relates to a carbon nanotube thin film in which a plurality of carbon nanotubes are aligned in one direction within a film plane, and a production process thereof.

BACKGROUND ART

A momentum has been increased for applying carbon nanotube (hereinafter also referred to as CNT) as a constituent material for Micro Electro Mechanical Systems (MEMS) devices or electronic devices in the field of nanotechnology. For obtaining such devices, it has been demanded for a CNT film structure in which a CNT layer including a film-like CNT aggregate comprising a plurality of CNTs (hereinafter also referred to as a CNT film) is deposited on the surface of a substrate.

In the present specification, "carbon nanotube (CNT) film structure" means a structure in which a CNT layer is disposed on a substrate and denotes a structure used as a wafer, for example, of electronic devices or MEMS devices, and it includes not only a substrate having planar surface but also a substrate having an uneven surface and a substrate of a three-dimensional structure in which the surface of a substrate having a protruded structural portion is covered with a CNT film. Further, "CNT aggregate" in the present specification means a structure in which a plurality of CNTs (for example, at a number density of $5 \times 10^{11}$ CNTs/cm$^2$ or more) are aggregated in a layered or a bundled state. Further, "CNT film" referred to in the present specification means a plurality of CNTs aggregated in a thin film or thin-plate shape and includes those of sheet, foil, ribbon shapes.

As techniques for producing such a CNT film structure, there have been known a technique of forming a step difference at the surface of a substrate and growing CNTs from the side wall of the step difference in parallel with the surface of the substrate, that is, a technique of producing a film structure having a CNT layer aligned in parallel with the surface of the substrate by using a chemical vapor deposition method (hereinafter also referred to as a CVD method) (refer to JP-A No. 2003-081622), and a technique of coating a liquid suspension of CNTs on a substrate by a spin coating method thereby depositing a non-woven fabric comprising CNT to the surface of the substrate, that is, a technique of producing a film structure with planar surface having a CNT layer (refer to JP-T No. 2005-524000).

However, in the CNT film structure described in JP-A No. 2003-081622, since a stepped substrate is used, it is substantially impossible to planarize the surface of the CNT layer. In addition, the step difference is intended for forming the CNT layer and this is not necessary as a CNT film structure. Since such a step difference rather hinders the laying of wirings, it involves a problem of making the production of an electronic device extremely difficult. Further, since it is necessary that a substrate used in the process for forming the CNT layer (substrate for synthesizing CNT) is identical with a substrate as a film structure (wafer substrate), it is difficult to form the CNT layer at an optional position of an optional substrate and, in addition, only the substrate which withstands a heat treatment during CNT synthesis can be used for the CNT film structure. Further, the CNT layer formed as described above generally has low density (0.03 g/cm$^3$ or less) and is in a fluffy state. Then, since a liquid agent such as a resist impregnates into a gap between CNTs in a state as formed, shaping processing by well-known patterning technique or etching technique is extremely difficult.

On the other hand, in the CNT film structure described in JP-T No. 2005-524000, a liquid suspension of CNTs has to be coated over and over for obtaining a CNT layer of a desired thickness and this tends to complicate the production steps. Further, while a CNT layer in which a plurality of CNTs are aligned in one identical direction can be provided with a property which is different between the alignment direction of CNTs and a direction perpendicular thereto, that is, anisotropy with regard to electric property (for example, conductivity), optical property (for example, transmittance), or mechanical characteristics (for example, bending property), it is difficult in the CNT film structure described in JP-T No. 2005-524000 to align a plurality of CNTs in one identical direction (providing anisotropy) in view of the production process thereof.

JP-A No. 2006-228818 proposes a technique of synthesizing a plurality of vertically aligned CNTs on a substrate and then turning down them thereby aligning the CNTs in parallel with the substrate. However, as it is apparent that JP-A No. 2006-228818 intends to prevent bundling of CNTs (column 0048), no technical idea of using a plurality of CNTs as an aggregate is not recognized therein. Further also in this case, shaping processing by well-known pattering technique and etching technique is substantially impossible.

JP-A No. 2007-182352 proposes a technique of increasing the density of a CNT aggregate aligned in a predetermined direction thereby enhancing the rigidity thereof. This can solve the problem of the existent CNT aggregate that the density is low and the strength is poor. However, this JP-A No. 2007-182352 does not suggest formation of a CNT layer in which a plurality of CNTs are aligned continuously along a film plane.

JP-A No. 2007-182352 also considers a method of exposing a CNT aggregate to a liquid and then applying a pressure in a direction oblique to the alignment direction by way of a planar plate or the like, thereby turning down the CNTs. However, in this case, since the CNT aggregate is adhered to the plate or the CNT aggregate, undergoes damage or causes warp not being durable to the pressure, it is difficult to obtain a CNT film structure having a CNT layer of high density and uniform thickness. Further, since the thickness of the film is limited to 3 μm to 20 μm and, in addition, since CNTs are turned down, it is difficult to obtain a thin film by using CNTs of large size in the height. With the reasons described above, the structure described in JP-A No. 2007-182352 is not suitable to MEMS application use that requires a highly integrated arrangement.

Further, referring to the alignment, the CNT film structure described in JP-A No. 2007-182352 is formed by obliquely turning down, under pressure, the CNT aggregate aligned vertically from the substrate and the direction of the CNTs on the substrate is forcedly changed by an external force before and after the pressure-turn down treatment. That is, in the technique described in JP-A No. 2007-182352, the way of applying the pressure gives a significant effect on the alignment and it is difficult to obtain a CNT film structure in which a plurality of CNTs are aligned at a high level.

Even when the CNT aggregate vertically aligned above the substrate (state in FIG. 1(a)) is exposed to a liquid, it forms an Island shape as shown in FIGS. 1(b), 1(c), 1(d) (refer to Nirupama Chakrapani, et al., Capillarity-driven assembly of two dimensional cellular carbon nanotube foams. Proceedings of the National Academy of Sciences, 2004.3.23, vol. 101, p. 4009-4012), and a CNT layer of a uniform thickness in which the alignment direction of CNTs are in parallel with the surface of a substrate and directed in one identical direction cannot be formed.

SUMMARY OF THE INVENTION

As can be seen in each of the patent documents described above, no technique for obtaining a CNT film structure in which high density aligned CNT layers are deposited above a substrate has been found at all. In the first place, since CNT is synthesized under a high temperature atmosphere, substrates that can be used are restricted and no technical ideas, for example, of intending to synthesize CNT on a substrate provided with a three dimensional structure (unevenness or like other structure) have been not present. That is, in the prior art, it was extremely difficult to dispose a CNT layer of optional shape to an optional position of an optional substrate and production of high density aligned CNT film structure was substantially impossible.

Further, since a CNT film formed by a CVD method or the like generally had a low weight density in a state as formed, it was impossible to apply a well-known integrated circuit production process that requires coating of a resist or the like.

Further, for a CNT aggregate in which the alignment degree of CNTs is low or CNTs are not aligned at all, a gap between individual CNTs in the assembly is inevitably increased and the filling density is not increased sufficiently even when they are compressed, for example, by applying an external pressure (refer to FIG. 2(a)) and integrity and solidness capable of satisfying desired mechanical property cannot be obtained.

The problems described above result significant impediments in using a CNT film structure to an application use, for example, of MEMS that requires mechanical operation.

The present invention has been accomplished in view of the situations in the prior art and it mainly intends to provide a CNT film structure of high quality in which a CNT layer having a plurality of CNTs aligned continuously in one identical direction along a film plane and having high density and uniform thickness is deposited above a substrate, that is, a CNT film structure having a CNT film of an optional shape having excellent physical property and a substrate of an optional shape and material.

Further, the invention also intends to provide a CNT film structure having a CNT layer with anisotropy constituted with a CNT aggregate comprising a plurality of CNTs on the surface of a stepless planar substrate, or a three dimensionally shaped CNT film structure in which the surface of a substrate having a protruded structural portion or unevenness is covered with a CNT layer having anisotropy.

Further, the invention also intends to provide a CNT thin film in which a plurality of CNTs aligned in one direction within a film plane are filled at a high density.

In order to solve the problems described above, the present invention provides the following CNT film structure and the production process thereof.

[1] A method of producing a CNT film structure having a substrate and a CNT layer, in which a step of forming the CNT layer includes a placing step of placing a CNT film comprising a plurality of CNTs aligned in one direction in a film plane on the substrate, and a densifying step of applying a densifying treatment to the CNT film thereby increasing the weight density of the CNT to 0.1 g/cm$^3$ or more. According to the method, the CNT films shrink in the direction perpendicular to the alignment direction of CNTs by the presence of the substrate to which the film is placed. Accordingly, densification proceeds uniformly and a CNT film structure with a CNT layer having anisotropy, with no step difference and of planar surface can be produced easily. In addition, when the alignment property of CNT is high, since a distance between individual CNTs to each other is naturally narrowed (refer to FIG. 2(b)) and the bonding force (Van der Waals' force) between each of CNTs that constitute the CNT layer is further increased, integrity and the solidness as the CNT film structure are improved to obtain a desired mechanical strength. Further, by increasing the density of the CNT layer to such a high level, since coating of a resist is possible, the CNT layer can be fabricated by applying a well-known patterning technique or etching techniques. The alignment property of CNT required for the CNT film of the invention is not necessarily complete so long as the densifying step can be practiced, and the integrity, the shape retainability, and the shape processability of the CNT layer are within an allowable level for putting the MEMS device to practical use.

[2] A substrate on which the carbon nanotube layer is provided is defined as a substrate for forming the carbon nanotube layer.

[3] A substrate on which the carbon nanotube layer is provided is defined as a substrate different from a substrate for forming the carbon nanotube layer.

[4] The carbon nanotube layer is configured by laminating a first carbon nanotube layer applied with a densifying treatment and a second carbon nanotube layer applied with a densifying treatment.

[5] The placing step in [1] above is defined as a step of placing a plurality of CNT films in which a plurality of CNTs are aligned in one direction within a film plane in lamination on the substrate. According to this, anisotropy given over the entire CNT film structure can be controlled by the alignment of each of the CNT films in lamination.

[6] The densifying step in [1] above is defined as a step of exposing the CNT film to a liquid and then drying the same while maintaining the alignment direction of CNTs as it is. According to this, since the alignment state does not change before and after the densifying step and the alignment state during growth is carried on as it is, the CNT film can be densified without damaging the CNTs.

[7] The densifying treatment is applied such that the Herman's Orientation Factor is 0.6 or more.

[8] The CNT layer is patterned into a desired planar shape. According to this, the CNT layer can be formed at a desired position in a desired shape.

[9] The substrate has an unevenness of a predetermined shape.

[10] The carbon nanotube layer is placed on the uneven shape portion in the form of a doubly clamped beam or singly clamped beam.

[11] A convex portion is formed in a plurality of pillar shapes and the height of the convex portion of the pillar shape and the area for the top face of the pillar are controlled, and the carbon nanotube layer is placed between convex portions of the pillar shape so as to bridge them.

[12] The carbon nanotube layer is formed by way of a process including a placing step of placing a carbon nanotube film on the substrate, the carbon nanotube film comprising a plurality of carbon nanotube aligned in one direction within a film plane on the substrate, and a densifying step of applying a densifying treatment to the carbon nanotube film thereby increasing the weight density of the carbon nanotubes to 0.1 g/cm$^3$ or more.

According to this, a CNT film structure having a CNT layer of a three dimensional shape can be obtained, and the CNT layer can be processed by applying well-known patterning techniques or etching techniques.

[13] The substrate provided with the carbon nanotube layer is defined as a substrate for forming the carbon nanotube layer.

[14] A substrate on which the carbon nanotube layer is provided is defined as a substrate different from a substrate for forming the carbon nanotube layer.

[15] The carbon nanotube layer is configured by laminating a first carbon nanotube layer applied with a densifying treatment and a second carbon nanotube layer applied with a densifying the treatment.

[16] The carbon nanotube layer is configured by laminating a first carbon nanotube layer applied with a densifying treatment and a second carbon nanotube layer applied with a densifying treatment.

[17] The placing step is defined as a step of placing a plurality of the carbon nanotube films in lamination on the substrate.

[18] The densifying step is defined as a step of drying the carbon nanotube film exposed to a liquid while maintaining the alignment property of the carbon nanotubes as it is.

[19] The carbon nanotube layer is patterned.

[20] The substrate has an unevenness of a predetermined shape.

[21] A carbon nanotube film structure having a substrate and a carbon nanotube layer and further having a structural portion with a planar top face protruded from the substrate, in which the carbon nanotube layer has a carbon nanotube film comprising a plurality of carbon nanotubes aligned in one direction within a film plane, the weight density thereof having increased to 0.1 g/cm$^3$ or more, and disposed in a three-dimensional manner so as to cover the structural portion above the substrate.

[22] The carbon nanotube layer is placed in the shape of a doubly clamped beam or a singly clamped beam to the uneven shape portion.

[23] The convex portion is formed into a plurality of pillar shapes, the height for the convex portion of the pillar shape and the area for the top face of the pillar are controlled and the carbon nanotube layer is placed between the convex portions of the pillar shape so as to bridge them.

[24] A method of producing a carbon nanotube film structure having a substrate, a structural portion having a planar top face protruded from the substrate, and a carbon nanotube layer disposed in a three-dimensional manner so as to cover the structural portion above the substrate, in which the step of forming the carbon nanotube layer includes; a placing step of placing a carbon nanotube film comprising a plurality of carbon nanotubes aligned in one direction within a film plane on the substrate having the structural portion and a densifying step of applying a densifying treatment to the carbon nanotube film thereby increasing the weight density of the carbon nanotube to 0.1 g/cm$^3$ or more.

[25] The placing step is defined as a step of placing a plurality of carbon nanotube films in lamination on the substrate.

[26] The densifying step is defined as a step of drying the carbon nanotube film exposed to a liquid while maintaining the alignment property of the carbon nanotube.

[27] The structural portion is a sacrificial layer of a predetermined shape disposed before the placing step and the shape of the carbon nanotube layer is controlled by removing the sacrificial layer after the densifying step.

[28] It is defined to have a carbon nanotube film comprising a plurality of carbon nanotubes aligned in one direction within a film plane and having a weight density increased to 0.1 g/cm$^3$ or more by a densifying treatment.

[29] A method of producing a carbon nanotube thin film having a carbon nanotube film comprising a plurality of carbon nanotubes aligned in one direction within a film plane including; a placing step of placing the carbon nanotube film on a substrate, a densifying step of applying a densifying treatment to the carbon nanotube film thereby forming a carbon nanotube layer having a weight density of the carbon nanotubes of 0.1 g/cm$^3$ or more, and a peeling step of peeling the densified carbon nanotube layer from the substrate.

[30] It is defined to have a substrate different from a substrate for forming carbon nanotubes, and a carbon nanotube film applied with a densifying treatment placed on the substrate while being controlled for position and/or alignment.

[31] It is defined to have a substrate different from a substrate for forming carbon nanotubes, and a carbon nanotube film applied with a densifying treatment and placed on the substrate while being controlled for position and/or alignment and being patterned.

[32] It is defined to have a substrate different from a substrate for growing carbon nanotubes, a first carbon nanotube film applied with a densifying treatment and placed on the substrate while being controlled for position and/or alignment and being patterned, and a second nanotube film applied with a densifying treatment and placed on the first carbon nanotube film while being controlled for position and/or alignment and being patterned.

[33] It is defined to have a substrate different from a substrate for forming carbon nanotubes formed with an unevenness, and a carbon nanotube film applied with a densifying treatment and placed on the unevenness while being patterned as a doubly clamped beam or a singly clamped beam.

[34] It is adapted to have a substrate different from a substrate for forming carbon nanotubes formed with the pillars, a carbon nanotube film applied with a densifying treatment and placed on the substrate bridging the pillar while controlling the height of the pillars formed to the substrate, the area in contact with the carbon nanotube film, and the distance on the pillar, or a bridged carbon nanotube comprising a second carbon nanotube film applied with a densifying treatment and placed on the first carbon nanotube film while controlling the position and/or alignment and being patterned above the first carbon nanotube film.

According to the invention adopting the technical means or method described above, it is possible to easily provide a CNT film structure having a film-like CNT layer in which a plurality of CNTs aligned continuously in one direction along the film plane are filled at a high density and having a uniform thickness, and a remarkable effect can be provided for solving the problems described previously.

In the highly aligned CNT film constituting the CNT film structure, CNTs are intensely bonded to each other to such an extent that an integrity as a film can be maintained even when the film is detached from a synthesis substrate. That is, the invention can provide a technique which gives a remarkable turning point compared with the prior art in that the CNT film can be detached from the synthesis substrate and placed on other optional substrate. This is to be described below It is considered that the phenomenon in which densification proceeds when a CNT aggregate deposited with a liquid is dried is caused by adhesion of each of CNTs adjacent with each other due to the surface tension upon evaporation of the liquid deposited to individual CNTs. That is, when the CNT aggregate is formed into a film shape and a densifying treatment is applied with the alignment direction thereof being in parallel with the surface of the wafer substrate, not only the movement of individual CNTs along the surface of the wafer substrate is restricted by adhesion between the CNT film and the wafer substrate but also the direction of shrinkage of the CNT film is defined in one dimensional manner in the direction perpendicular to the wafer substrate also due to the generation of the surface tension exclusively in the direction of height by the evaporation of the liquid from the side of the CNT film. Since the density of the CNT film is uniformly increased only in the direction of the thickness by the situations described above, the problem of shrinkage in the island shape in a case applying the densifying treatment to the bulky CNT aggregate grown vertically from the synthesis substrate does not occur.

That is, according to the invention of placing the CNT film on the wafer substrate different from the synthesis substrate and applying the densifying treatment thereto, since the densification proceeds only in the direction of the thickness and a CNT film having a sufficiently high weight density and aligned highly along the film plane can be obtained, a CNT film structure provided with a high density CNT layer at an optional position of an optional substrate can be produced.

In the CNT film structure, since CNTs constituting the CNT layer are closely gathered (filled), the integrity as an individual body can be maintained and since the resist can be coated (confirmed in the CNT layer at a weight density of 0.1 g/cm$^3$), a well-known integrated circuit production process technique is applicable. As a result, while the processing step was performed to CNTs depending on the place where the CNTs are present, since the device can be prepared while previously setting an optional place, design is facilitated and further integration can be expected. Further, since a substrate free of thermal hysteresis can be used, application to various application fields can be intended as a wafer for forming electronic devices, MEMS devices, or electronic circuits.

Further, according to the invention, an optional three-dimensional film structure having the same CNT layer as described above on a substrate having unevenness or a substrate provided with a protruded structure can be provided easily. Since the well-known patterning technique and etching technique are applicable to the film structure as described above, a hollow structure or a three dimensional structure which is essential in the application use of MEMS can be produced by using a well-known integrated circuit production process. Particularly, since the physical properties of the MEMS device of a three dimensional structure depend on the shape thereof, capability of forming a desired three dimensional shape means that an MEMS device having a desired physical property can be formed. That is, the invention can provide a wafer that can be used suitably to the manufacture of the electronic devices, MEMS devices, or electronic circuits.

Further, according to the invention, a high density CNT thin film in which a plurality of CNTs are aligned in one direction within a film plane can be provided easily. Since the CNT thin film has the same physical property as described above and the well-known pattering technique and etching technique are applicable thereto, compatibility with the integrated circuit production process is enhanced and the thin film can be used suitably to the manufacture of wafers for forming electronic devices, MEMS devices or electronic circuits.

BRIEF DESCRIPTION OF THE DRAWINGS

FIG. 1 is a view showing a state when a bulky CNT aggregate is exposed to a liquid, in which FIG. 1(a) shows a bulky CNT assembly vertically aligned above a substrate, FIGS. 1(b), 1(c), and 1(d) show the states where it is increased in the density into an island form at different magnification ratios;

FIG. 2 is an explanatory view schematically showing the importance of alignment of CNT upon densification, in which FIG. 2(a) shows CNT with no alignment and FIG. 2(b) shows an aligned CNT;

FIG. 3 is a cross sectional view schematically showing a CNT film structure according to an embodiment of the invention;

FIG. 4 is a view showing a CNT film applied to a CNT film structure of the invention, in which FIG. 4(a) is an optical microscope photographic image and FIG. 4(b) is a transmission electron microscope (TEM) photographic image enlarged further for a portion thereof:

FIG. 10 is a view showing the state of alignment of a thin film, in which FIG. 10(a) is an atomic force microscope (AFM) image for a thin film before densification, FIG. 10(b) is an AFM image for the thin film after densification and FIG. 10(c) is a graph showing the dependence of a thin film on the Raman G band intensity after densification;

FIG. 13 is a perspective view showing an example of a structure for a CNT film structure in which FIG. 13(a) is an entire view, FIG. 13(b) is a fragmentary view, FIG. 13(c) represents a wafer substrate provided with a plurality of pillars and FIG. 13(d) shows a state of applying a lattice-like pattern conformed to the pillar top to the CNT layer;

FIG. 14 is a perspective view showing another example of the structure for the CNT film structure where the shape of the pillar is made different; in which FIG. 14(a) shows a state before patterning and FIG. 14(b) shows the state after patterning;

FIG. 15 is a perspective view where a wafer substrate having a plurality sets of wafers each set comprising three pillars is covered with a CNT layer to form a three dimensional film structure, in which FIG. 15(a) shows a state before providing the CNT layer, FIG. 15(b) shows a state after disposing the CNT layer, FIG. 15(c) shows a state of FIG. 15(b) at a different magnification factor, and FIG. 15(d) shows a state of applying a linear pattern conformed to a pillar top to the CNT layer;

FIG. 16 is a perspective view showing another example of the structure for the CNT film structure, in which FIG. 16(a) shows a state of placing a CNT thin film so as to cover a plurality of sacrificial layers laid over the substrate and applying patterning and FIG. 16(b) shows a state of forming a hollow structure while removing the sacrificial layer;

FIG. 17 is an electron microscope photographic image showing the state of laminating two CNT films, in which FIG. 17(a) shows the films crossing to each other on a plane in the direction of alignment and FIG. 17(b) shows the films aligned in the identical direction;

FIG. 18 is a graph showing the change before and after densification, In which FIG. 18(a) shows the relation between the original thickness and the thickness after densification of a CNT film and FIG. 18(b) shows a relation between an original thickness and a density after densification of the CNT film;

FIG. 32 is a view for explaining a method of producing a CNT micro structure by providing a sacrificial layer.

DESCRIPTION OF THE PREFERRED EMBODIMENTS OF THE INVENTION

Figure 1:
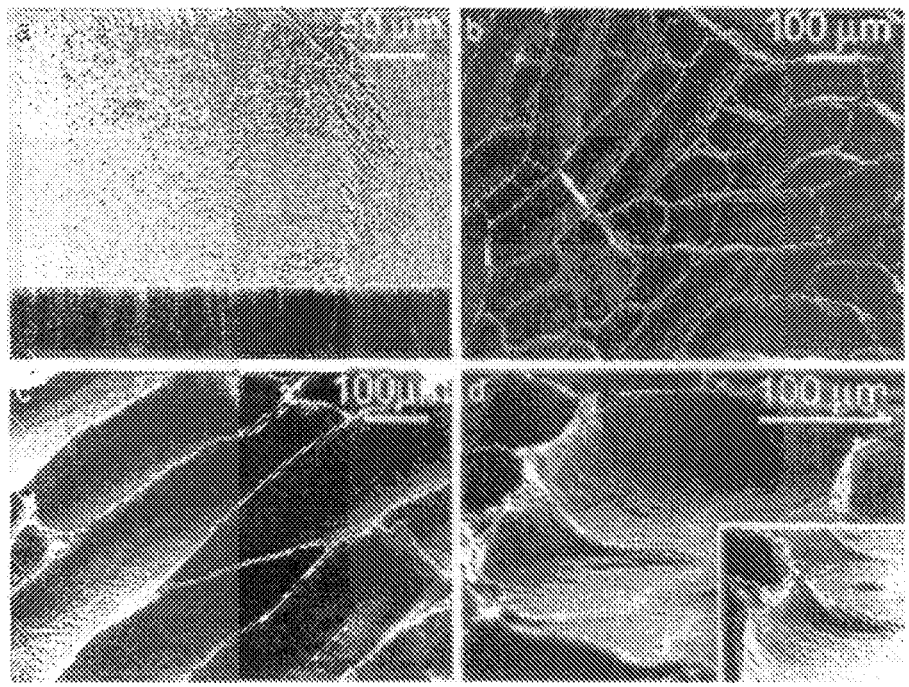

Hereinafter, the modes for carrying out the invention will be described in detail with reference to the appended drawings.

<CNT Film Structure>

A basic structure of a CNT film structure according to an embodiment of the invention is shown by a schematic cross sectional view of FIG. 3. A CNT film structure 1 of this embodiment has a CNT layer 3 formed by increasing the density of a plurality of CNT aggregates aligned in one direction in parallel with the surface of a wafer substrate 2 deposited on the wafer substrate 2 different from a synthesis substrate used for the synthesis of CNT by a CVD method in principle. Depending on the case, the synthesis substrate may be used as it is as the wafer substrate 2. Further, the CNT layer 3 can be formed by using a single or plurality of CNT films.

In the plurality of CNTs constituting the CNT layer 3, CNTs adjacent with each other are strongly bonded by Van der Waals' force and the weight density of CNT in the CNT layer 3 is generally from 0.1 to 1.5 g/cm$^3$ and, preferably, from 0.2 to 1.5 g/cm$^3$. In a case where the weight density of CNTs in the CNT layer 3 is at or more than the lower limit described above, CNTs are filled uniformly with no gaps, the CNT layer 3 exhibits a rigid state as a solid to obtain a required mechanical strength (rigidity, bending property, etc.). On the contrary, in a case where the weight density of CNTs is less than the value described above, a distinct gap is formed between each of CNTs that constitute the CNT layer 3. Accordingly, the CNT layer 3 is no more rigid solid and not only the required mechanical strength cannot be obtained but also a liquid agent, for example, a resist penetrates into the gap between each of the CNTs when it is intended to be coated, application of a well-known patterning technique or etching technique becomes difficult. Generally, while higher weight density of CNTs in the CNT layer 3 is more preferred, the upper limit value thereof is about 1.5 g/cm$^3$ with a view point of restriction in the production.

Further, in the invention, it is preferred that the CNT layer 3 has a Herman's Orientation Factor of 0.6 or more, preferably, 0.7 or more with a view point of densification.

The thickness of the CNT layer 3 can be optionally set to a desired value depending on the application use of the CNT film structure 1. In a case where the thickness is 10 nm or more, integrity as a film can be maintained, and this can provide a conductivity required for giving a function as an article used for electronic devices or MEMS devices. There is no particular restriction for the upper limit value of the thickness, a range of about 100 nm to 50 μm is preferred in a case where the structure is utilized for the electronic devices or MEMS devices.

In a case where the CNT layer 3 has the density and the thickness as described above, a circuit or a device of an optional shape can be easily formed, for example, by coating a resist on the CNT layer 3, drawing an optional pattern using a resist by lithography, and etching an unnecessary portion of the CNT layer 3 using the resist as a mask. That is, this enables to apply a well-known patterning technique or etching technique to enhance the compatibility with an integrated circuit production process.

CNTs forming the CNT layer 3 may be either a single walled layer or a multi-walled layer. The type of the CNT to be used can be determined depending on the application use, etc. of the CNT film structure 1. For example, in a case where high conductivity or flexibility is required, a single-walled CNT can be used and, in a case where importance is attached to rigidity or metallic property, a multi-walled CNT can be used.

Further, since the CNT layer 3 of the CNT film structure 1 of the invention includes a CNT film comprising a plurality of CNTs aligned in one direction in parallel with the surface of the wafer substrate 2, anisotropy can be provided for the electric property, optical property, or mechanical property between the alignment direction and the direction perpendicular thereto.

The CNT film structure 1 of the invention may be produced by synthesizing a CNT film to a desired thickness in a chemical vapor deposition step (to be described later specifically) and increasing the density thereof to form the CNT layer 3 of a desired thickness, or synthesizing a plurality of CNT films in the chemical vapor depositions step, and increasing the density while laminating the films to form the CNT layer 3 of a desired thickness. The former method has an advantage capable of obtaining the CNT layer 3 with an aimed density by a single sheet of CNT film. The later method has an advantage capable of laminating a plurality of CNT films each in an identical alignment direction, or laminating them in different alignment directions thereby obtaining the CNT layer 3 laminated in various ways.

FIG. 4 shows an example of a CNT film applied to the CNT film structure 1 of the invention. FIG. 4(a) is an optical microscope photographic image and FIG. 4(b) is a transmission electron microscope (TEM) photographic image. It can be observed from the drawing that the CNT film has an excellent alignment property.

Figure 5:
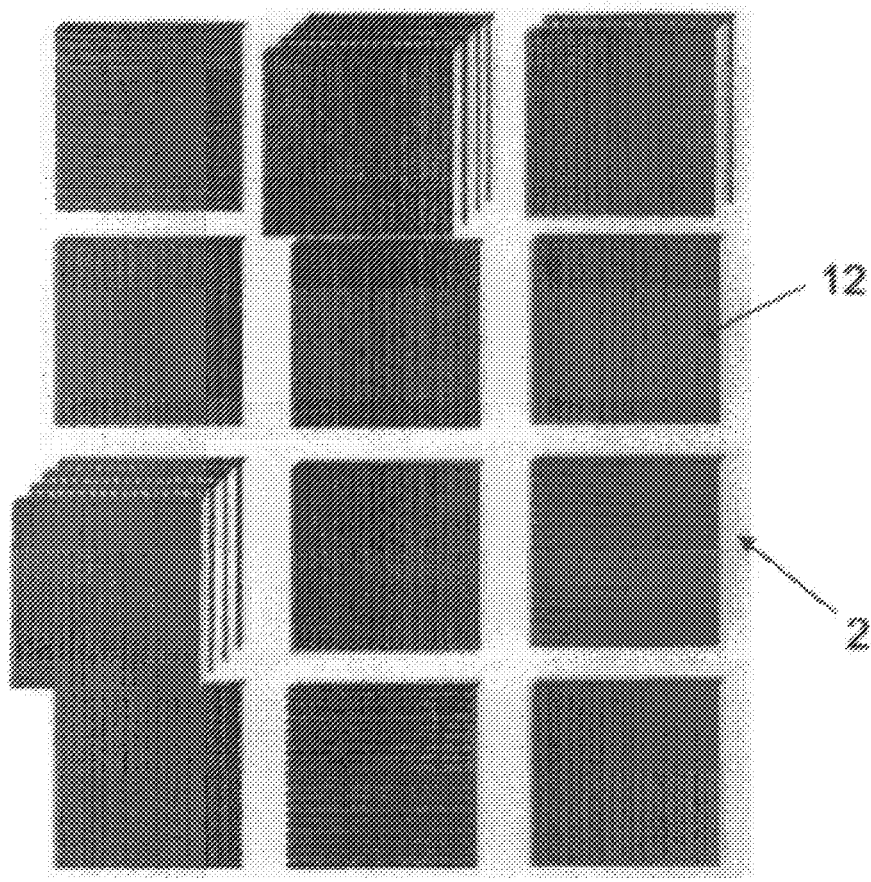
FIG. 5 is an explanatory view for exemplifying a lamination method of CNT.

FIG. 5 shows an example of a lamination method of CNT films. In a case of laminating a plurality of CNT films while making their alignment directions identical, this provides a merit capable of easily controlling the thickness of the CNT layer 3 by the setting of the number of films to be laminated. Further in a case of laminating a plurality of CNT films while making their alignment directions different from each other, it is possible, in addition to easy control of the thickness, to provide a plurality of anisotropic properties with the directionality being different from each other or optionally control such anisotropy.

In the CNT film structure 1 of the invention, the region of the CNT layer 3 may be formed by the number of one, or may be formed in plurality on the wafer substrate 2. Further, the regions may be formed being spaced from each other.

Further, according to the invention, the CNT thin film can be prepared by peeling the CNT layer 3 from the wafer substrate 2 for the CNT film structure 1. As the method of peeling the CNT layer 3, a method of immersing the CNT film structure 1 in an appropriate solution and peeling the layer by an appropriate tool such as tweezers.

When a plurality of CNT films are placed and densified, since not only they shrink in the normal direction to the substrate due to the surface tension of a liquid on the surface of the substrate but also a portion of the CNT film may sometimes warp and be densified at the surface of the substrate, the followings are to be taken into consideration.

(A1) In a case of laminating a plurality of CNT films, it should be adapted such that the micro structure provided with the first sheet of CNT film should not be swept upon placing the second sheet of CNT film.

(A2) In a case of using a film, for example, of 8 μm thickness as a CNT film at or after the second sheet, since the CNT film at or after the second sheet may sometimes warp depending on the liquid used for densification, such a state should be prevented.

The point A1 described above can be coped with by reducing the thickness of the CNT film as thin as 20 μm and counting the number of lamination of the CNT films under a stereomicroscope.

For the point A2 described above, the problem can be overcome by changing the illumination intensity of the stereomicroscope used for observation from the maximum to the minimum just before drying to solidness. This is estimated that the drying state of the CNT film is controlled and the warp can be suppressed by adjusting the lightness of the stereomicroscope Further, it is preferred that a CNT film gripped by tweezers is transferred to the needle tip of a manipulator having a needle, and arranged while controlling the manipulator at a desired position and in a desired alignment together with a manipulator also having a needle, and retained by the manipulators, and then a solution used for the densification is dropped and solidified. In this case, for effectively preventing the warp, it is particularly preferred to use methanol as a solution for the densification. With such a procedure, even in a case where a CNT micro structure is already present in the undertayer, CNT at and after the second layer can be placed easily without sweeping the CNT film of the CNT micro structure. The manipulator may be detached after drying. Such a method is effective in a case of handling a CNT film with a thickness of 4 μm or less.

In the present specification, the alignment state of CNTs means a state where Herman's Orientation Factor is 0.6 or more and, preferably, 0.7 or more. The CNT film structure to which it is placed may have a Herman's Orientation Factor of 0.6 or more, preferably, 0.7 or more irrespective of the densifying treatment.

The state where the position of the CNT film structure is controlled means a state where the CNT film structure is placed in a desired region on a substrate requiring the CNT film structure. Further, the state where the alignment of the CNT film structure is controlled means a state where the CNT film structure is directed to a necessary alignment direction within an allowable range. The state with no warp to the CNT film structure means a state where the CNT film structure is placed in a desired region on the substrate requiring the CNT film structure.

The CNT constituting the CNT layer 24 may be a single-walled CNT or multi-walled CNT. The type of the CNT to be used can be determined depending on the application use of the CNT film structure 21, etc. For example, a single-walled CNT can be used in a case where high conductivity or flexibility is required and a multi-walled CNT can be used in a case where importance is attached to rigidity or metallic property.

Further, since the CNT layer 24 of the CNT film structure 21 of the present embodiment includes a CNT film comprising a plurality of CNTs aligned in one direction and densified within the film plane, anisotropy can be provided for the electric property, optical property, or mechanical property between the alignment direction and the direction perpendicular thereto. Further, when the CNT layer 24 of the CNT film structure 21 in this embodiment is formed by laminating a plurality of CNT films different from each other with regard to the alignment direction, a plurality of anisotropic properties can be provided or the anisotropy can be controlled optionally.

Then, the CNT micro structure will be described. "CNT micro structure" means a patterned and processed CNT film structure.

Figure 25:
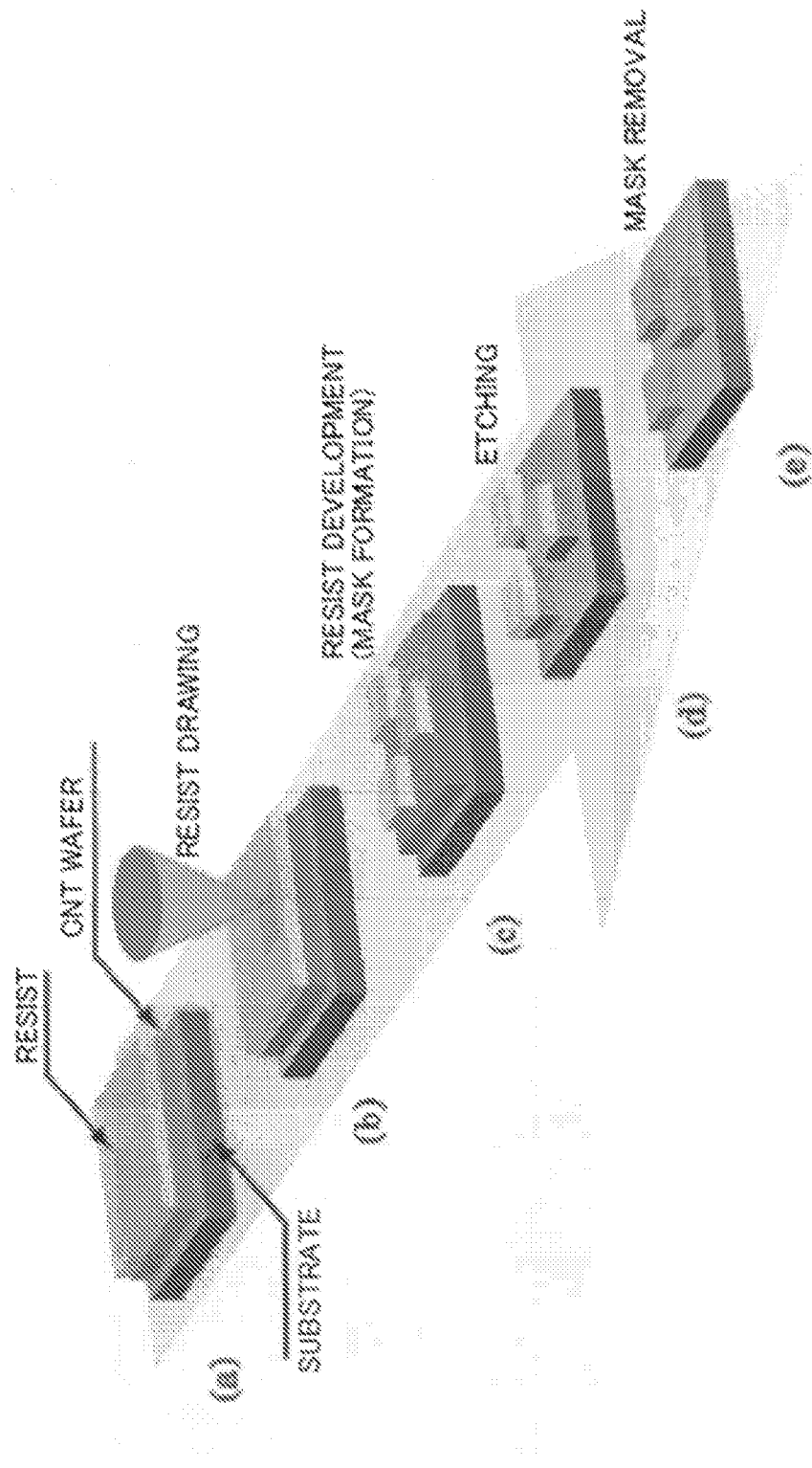
FIG. 25 is an explanatory view of a process for producing a CNT micro structure.

Referring to the method of preparing the CNT micro structure, a resist film 12 is at first coated to a CNT film structure 11 as shown in FIG. 25(a). As the resist film 11, any optional resist that constructs a shape such as an electron beam resist, photoresist, etc. can be used. Further, even when an etching selectivity to CNT is low, it may suffice that a resist of a sufficiently large thickness by more than the selectivity is formed to the CNT film structure 11.

Then, drawing conforming to the property of the resist film 12 (for example, electron beam drawing or photolithography) is applied to the resist film 12 coated on the CNT film structure 11 to draw a resist film 12A in a desired shape intended to be constructed as a CNT micro structure 11 (FIG. 25(b)).

Then, the drawn resist is developed to form a resist mask 13 on the CNT film structure 11 (FIG. 25(c)). Then, the CNT film structure 11 is etched to process the CNT film structure 11 into a desired shape by using the resist mask 13 (FIG. 25(d)). After the CNT film structure 11 is processed the resist mask 13 is removed to obtain a CNT micro structure of a desired shape (FIG. 25(e)).

When the CNT film is patterned in the invention, the followings should be taken into consideration.

(B1) Even for a densified CNT film, a silica type resist HSQ (hydrogen sllsequloxane) (FOX16: manufactured by ZEON Corp.) capable of obtaining a etching selectivity or the like cannot sometimes be coated uniformly. Further, it is sometimes difficult to obtain reproducibility of the HSQ resist.

(B2) It is desired that micro structures of CNT films of different alignment can be constructed on one substrate.

As a result of study made by the present inventors, et al., inflow of the HSQ below the CNT film can be prevented by coating and solidifying a diluted polymethyl methacrylate (PMMA) or resist (ZEP520A/ZEON Corp.) to form a film on the CNT film before coating the HSQ and then coating the HSQ thereover.

Also it is preferred to coat the HSQ twice or three times, penetrating the same sufficiently in the inside and below the CNT film and the HSQ sufficiently to form the mask above the placed CNT film is supplied to form a mask. Further, it is also advantageous to handle the HSQ in a globe box containing an inert gas atmosphere and is used being exposed in air by a necessary amount only upon coating of the resist. Further, it is preferred to conduct placing and densifying steps (transfer) to be described later.

<Three-dimensional CNT Micro Structure>

Figure 11:
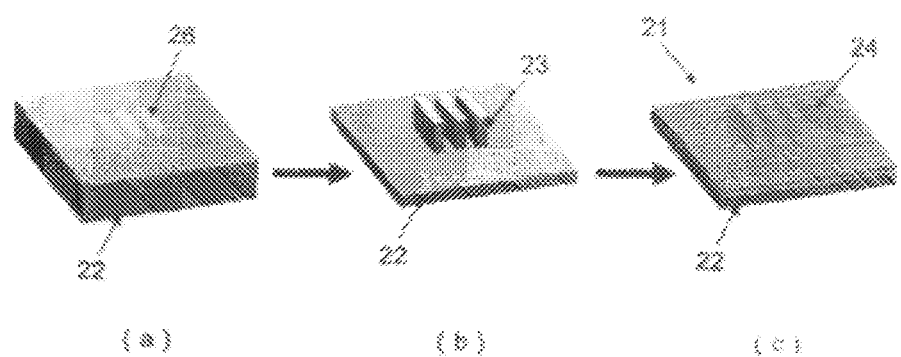
FIG. 11 is an explanatory view schematically showing a portion of a production step for a CNT film structure according to another embodiment of the invention.

Then, a three-dimensional CNT micro structure according to another embodiment of the invention will be described. The CNT micro structure is formed by using a wafer substrate having a convex shape structure, etc. The procedure for the production of the wafer substrate is as shown in FIG. 11.

The CNT film structure 21 of this embodiment is formed by depositing a CNT layer 24 in which a plurality of CNTs are aligned in one direction within a film plane and increased in the density is deposited to a wafer substrate 22 in which a plurality of pillars 23 are formed as a convex shape structure on the surface thereof and the CNT layer 24 forms two planes placed on planes different from each other (general surface of the wafer substrate and the top face of pillar).

In a case of manufacturing the structure, the followings should be taken into consideration.

(C1) When a CNT film is densified and placed over the unevenness, the CNT film placed so as to extend over the unevenness may sometimes be broken depending on the shape of the unevenness (specifically, depending on the height and the distance of pillars as the protrusions).

(C2) When an HSQ liquid utilized as a resist mask is coated to the densified CNT film placed on the unevenness, particularly, the CNT film extended between the pillars, the HSQ liquid flows not uniformly to the lower side of the CNT film extended above the protrusions making it sometimes difficult to conduct the mask forming step by an electron beam.

(C3) In the densified CNT film placed on the unevenness, the resist cannot be coated sufficiently, particularly, in a portion of covering the step, making it sometimes difficult to form the mask.

(C4) In the final processing stage, when the processing of the solution is completed and it is dried, the constructed structure may be destroyed depending on the drying method. That is, it may sometimes occur that the three-dimensional structure is collapsed or the position of the CNT structure designed and arranged on the substrate may be displaced.

For C1 described above, CNT breakage can be overcome by controlling the height of pillars as the protrusion, the area in contact with the CNT film on the pillar, and the distance.

Further, for C2 described above, inflow of the CNT film to the lower side of the CNT film can be prevented by coating and solidifying a diluted PMMA before coating of the HSQ to form a film on the CNT film and coating the HSQ thereover. Also, it is preferred to form a mask by coating the HSQ twice or three times, penetrating the same sufficiently to the inside and below the CNT film and supplying the HSQ sufficiently to form a mask to the upper side of the placed CNT film.

For C3 described above, problems can be solved by controlling the height of the pillar as the protrusion, the area in contact with the CNTs on the pillar and the distance, and use of the two types of the resist coating methods together.

For C4 described above, the problem can be solved, for example, by using IPA for densification and adopting spontaneous drying of IPA. When drying from an aqueous solution, particularly, water is adopted, it may sometimes destruct the three-dimensional structure (adhering of a hollow portion to the substrate), displace the CNT film from the substrate, or cause an error for the designed structure arrangement by the surface tension of water when it is evaporated. Further, also in a case of using acetone, a specimen is cooled by the heat of evaporation thereof, which causes condensation to provide the condition identical with that in the case of drying by using water. Accordingly, use of IPA or methanol is preferred. In addition to the drying method described above, it is also effective to use IPA or use a supercritical drying method with $CO_2$.

<Bridged CNT Micro Structure>

Then, a bridged CNT micro structure according to another embodiment of the invention will be described. The bridged CNT micro structure is obtained by forming a CNT film of a three-dimensional CNT film structure into a predetermined pattern.

Figure 26:
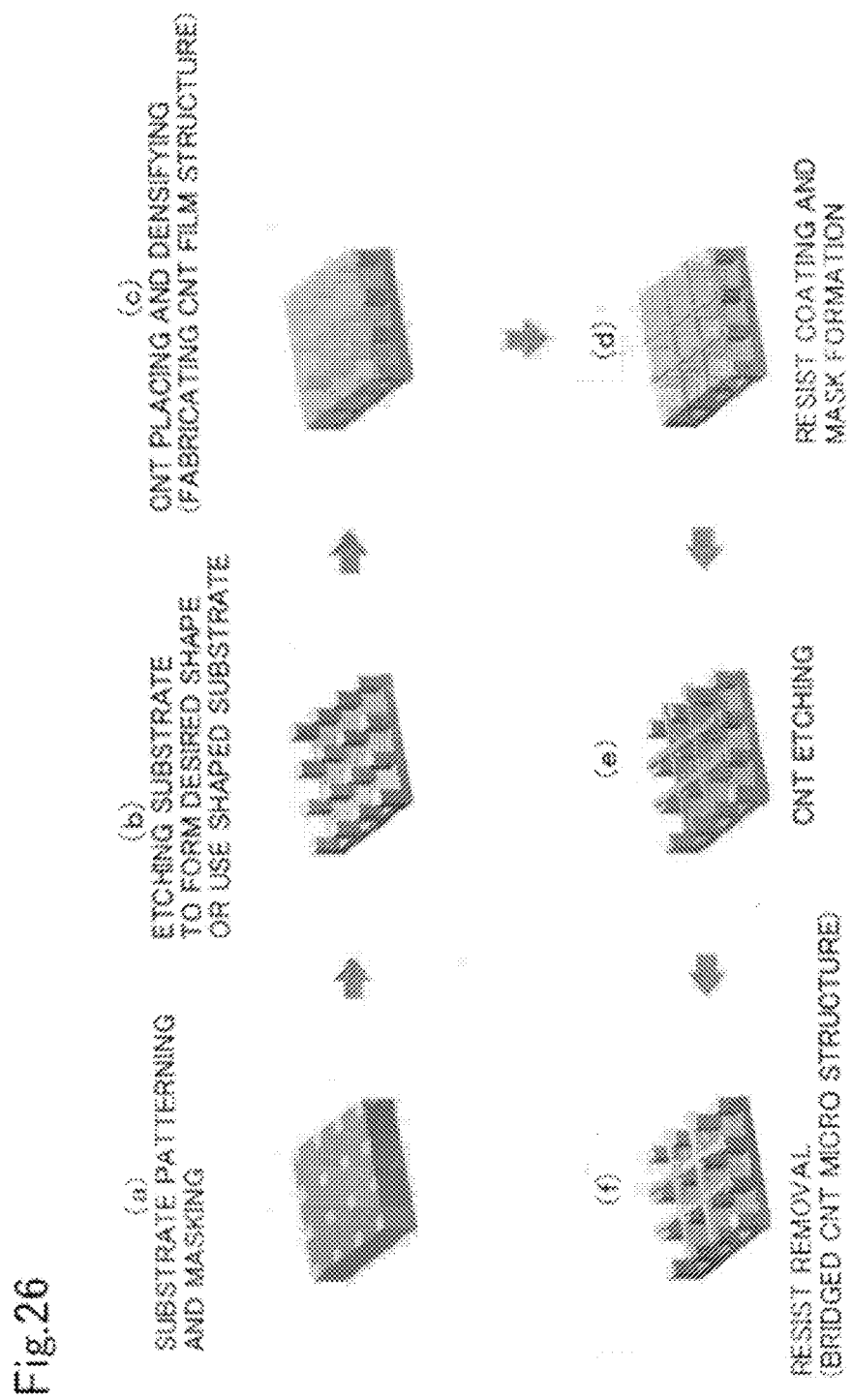
FIG. 26 is an explanatory view of a process for producing a bridged CNT micro structure.

A method of producing a bridged CNT micro structure of this embodiment is to be described with reference to FIG. 26.

As shown in FIG. 26(a), a substrate 26 is patterned by a customary method and a mask 27 having a resistivity to etching conditions for the substrate 26 is provided. Then, the substrate 31 is etched under predetermined etching conditions to form a desired uneven shape. Alternatively, a substrate having a shape shown in FIG. 26(b) not by way of the process described above may also be used. Then, as shown in FIG. 26(c), a CNT layer 28 is formed on the substrate 26 having the uneven shape to produce a CNT film structure.

Then, as shown in FIG. 26(d) a resist is coated on the CNT layer formed above the uneven shape and a resist mask 29 is constructed above the CNT film structure at a position and in a shape bridging the convex shape of the substrate 26. Then, the CNT layer 28 is etched and the CNT film structure is processed so as to construct a bridged CNT micro structure at a desired position and in a desired shape by the resist mask 29 (FIG. 26(e)). Then, as shown in FIG. 26(f), a resist mask 34 is removed to obtain a bridged CNT micro structure at a desired position and in a desired shape.

In the bridged CNT micro structure of the invention, when the CNT layer is patterned, the followings should be taken into consideration.

(D1) When the CNT film is densified and placed above the unevenness, since the CNT film structure placed so as to extend over the unevenness may sometimes be broken or distorted depending on the shape of the unevenness (specifically, depending on the height and the distance of the pillars as the protrusion), this should be prevented.

(D2) When an HSQ liquid utilized as a resist mask is coated to the densified CNT film placed on the unevenness, particularly, the CNT film extended between the pillars, the HSQ liquid flows not uniformly to the lower side of the CNT film extended above the protrusions making it sometimes difficult to conduct the mask forming step by an electron beam.

(D3) For the densified CNT film placed above the unevenness, particularly, the CNT film in the portion covering the step, it may sometimes occur that the resist cannot be coated sufficiently making it difficult to form a mask.

(D4) In the final process stage, when treatment for the solution is completed and it is dried, there may result a problem that the constructed structure may be collapsed or peeled depending on the drying method. That is, the bridged structure may be collapsed, or the position of the bridged CNT micro structure designed and arranged above the protrusions may sometimes be displaced.

For D1 described above, the problem of CNT breakage and distortion can be overcome by controlling the height of the pillars as the protrusions and the area in contact with the CNT film above the pillars, and the distance.

For D2 described above, inflow of the HSQ to the lower side of the CNT film can be prevented by coating and solidifying a diluted PMMA before coating of the HSQ to form a film on the CNT film and coating the HSQ thereover. Also, it is preferred to form a mask by coating the HSQ twice or three times, penetrating the same sufficiently to the inside and below the CNT film and supplying the HSQ sufficiently to form a mask to the upper side of the placed CNT film.

For the D3 described above, problems can be solved by controlling the height of the pillar as the protrusion, the area in contact with the CNTs on the pillar and the distance, and use of the two types of the resist coating methods together.

For the D4 described above, the problem can be solved, for example, by using IPA for densification and adopting spontaneous drying of IPA. When drying from an aqueous solution, particularly, water is adopted, it may sometimes destruct the three-dimensional structure (adhering of a hollow portion to the substrate), displace the CNT film from the substrate, or cause an error for the designed structure arrangement by the surface tension of water when it is evaporated. Further, also in a case of using acetone, a specimen is cooled by the heat of evaporation thereof, which causes condensation to provide the condition identical with that in the case of drying by using water. Accordingly, use of IPA or methanol is preferred. In addition to the drying method described above, it is also effective to use IPA or use a supercritical drying method with $CO_2$.

Since the CNT layer of the CNT film structure of the present embodiment includes densified, anisotropy comprising a plurality of CNTs aligned in one direction within the film plane, and densified, anisotropy can be provided for the electric property, optical property, or mechanical property between the alignment direction and the direction perpendicular thereto. Further, when the CNT layer of the CNT film structure in this embodiment is formed by laminating a plurality of CNT films different from each other with regard to the alignment direction, a plurality of anisotropic properties can be provided or the anisotropy can be controlled optionally.

Then, referring to the etching of the CNT film, when the CNT film is processed, for example, by reactive ion etching (RIE) with $O_2$, fluffed residues not burnt out completely may sometimes remain (they are estimated as passive state of C and some or other elements to $O_2$ plasmas). For this problem, it is effective to conduct fabrication by way of RIE using $O_2$ and Ar, RIE using $O_2$ and $CHF_3$, or by combination of three RIE conditions.

Then, a CVD apparatus used in the invention is to be described.

Figure 12:
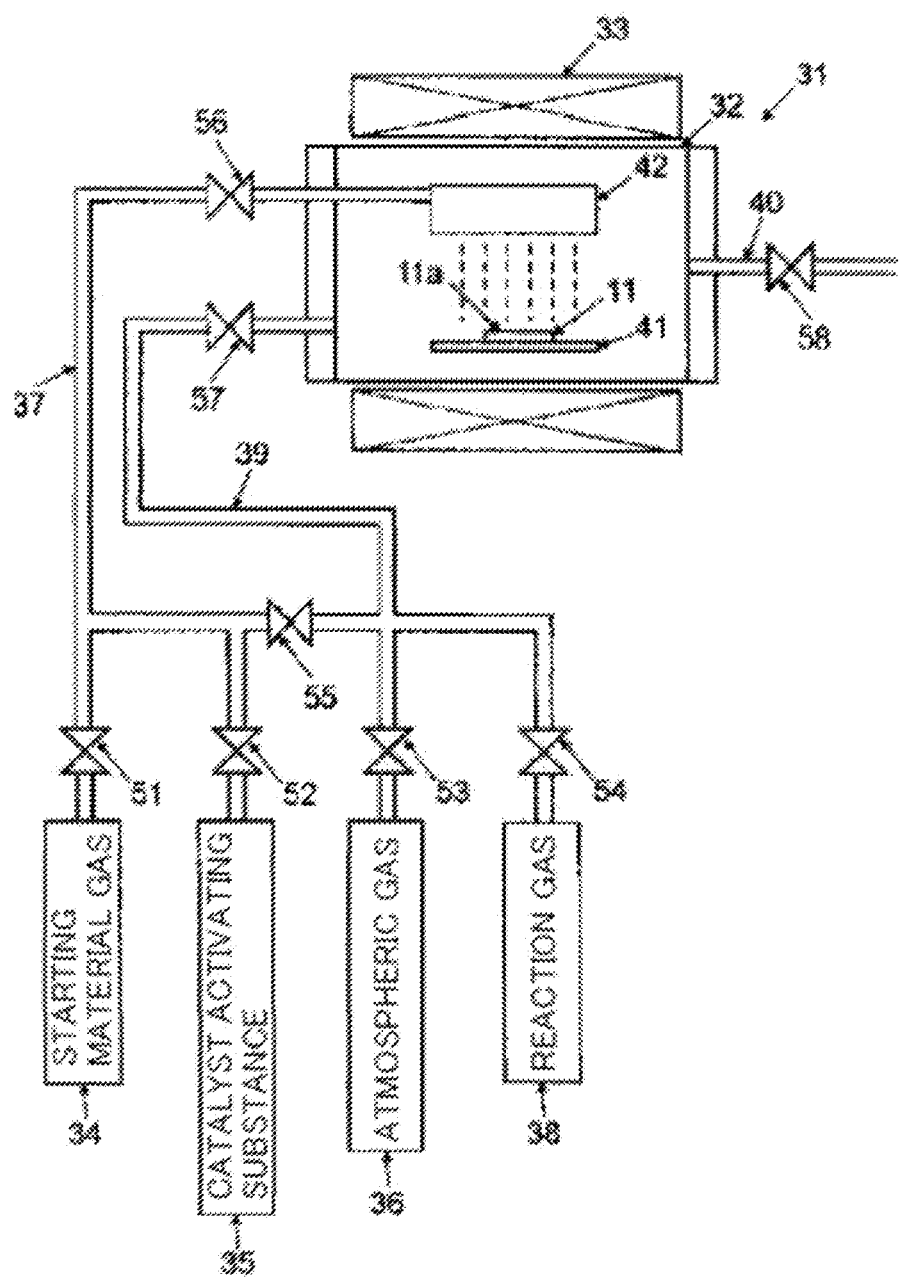
FIG. 12 is a constitutional view schematically showing a CVD apparatus used for the production of a CNT film in the example of the invention.

At first, an example of a CVD apparatus used in the production of CNT in the invention will be described more specifically. As shown in FIG. 12, a CVD apparatus 31 includes a tubular reaction chamber 32 formed of a quartz glass (tubular furnace:Model:KTF030 (30 mm diameter, 36 cm heating length), produced by Koyo Lindberg Co.) for accommodating a synthesis substrate 11 that supports a metal catalyst, a heating coil 33 disposed so as to externally surround the reaction chamber 32, two gas supply pipes 37, 39 (SUS304: 4.35 mm diameter) connected to one end of the reaction chamber 32 for supplying respective gases in a starting material gas reservoir 34, a catalyst activating substance reservoir 35, an atmospheric gas reservoir 36, and a reducing gas reservoir 38 to the reaction chamber 32, and a gas discharge pipe 40 (SUS304: 4.35 mm diameter) connected to the other end of the reaction chamber 32. Further, for supplying a trace amount of the catalyst activating substance under control at high accuracy, a purifying device for removing an oxidative material (not illustrated) is disposed additionally to a pipeline near the starting material gas reservoir 34 and the atmospheric gas reservoir 36.

At a lower position in the reaction chamber 32, a substrate holder 41 that holds a synthesis substrate 11 in a state with a catalyst deposition film forming surface 11a being directed upward is disposed, and a shower head 42 having a plurality of jetting ports distributed at an uniform density is disposed thereabove. The downstream end of a first gas supply pipe 37 is connected to the shower head 42. The jetting ports of the shower head are formed at a position facing the catalyst deposition film forming surface 11a of the synthesis substrate 11 placed on the substrate holder 41. Further, each of the jetting ports is disposed such that the jetting axial line is in a direction perpendicular to the catalyst deposition film forming surface 11a of the synthesis substrate 2. That is, they are adapted such that the direction of the gas stream jetting out from the jetting ports formed to the shower head 42 is substantially perpendicular to the catalyst deposition film forming surface 11a of the synthesis substrate 11.

A check valve, a flow control valve, a flow rate sensor, etc. are disposed at appropriate positions of the gas supply pipes 37, 39 and the gas discharge pipe 40. By on/off control for each of the flow rate control valves property by a control signal from a not illustrated control device, the starting material gas, the catalyst activating substance, the carrier gas, and the reducing gas are supplied each in a predetermined flow rate from both or one of the two gas supply pipes 37, 39 continuously or intermittently to the inside of the reaction chamber 32 depending on the reaction process.

Further, a separate carrier gas supply portion (not illustrated) is attached to the supply path of the catalyst activation material, and the catalyst activation material is supplied together with a carrier gas, for example, helium.

According to the CVD apparatus 31 constituted as described above, a plurality of CNTs can be grown on the catalyst deposition film forming surface 11a of the synthesis substrate 11 by blowing each of the gases like a shower by way of the first gas supply pipe 37 from the jetting ports of the shower head 42 to the catalyst deposition film forming surface 11a of the synthesis substrate 11, feeding each of the gases from the opening of the second gas supply pipe 39 to the inside of the reaction chamber 32, or feeding each of the gases from both of the two gas supply pipes 37, 39 to the inside of the reaction chamber 32. While the growing direction of the plurality of CNTs from the metal catalyst is generally in the direction perpendicular to the catalyst deposition film forming surface 11a of the synthesis substrate 11, the angle is not particularly defined so long as this substantially forms a predetermined direction.

A process for producing a CNT film structure will be described by way of a specific example.

A silicon wafer: 20 mm×20 mm was used as a CNT synthesis substrate, and Fe: 1 nm thickness/$Al_2O_3$: 35 nm thickness, 2 μm width×1.5 mm length were deposited thereon as a metal catalyst with oxide film of 600 nm thickness (existent amount) by sputtering vapor deposition. Deposition conditions are as described below.

Starting material gas: ethylene: 20 sccm feed rate
Atmospheric gas: helium; 100 sccm feed rate
Pressure: 1 atm
Catalyst activating substance: water vapor (existence amount): 9 ppm
Reduction gas: hydrogen; 900 sccm feed rate
Reaction temperature: 750° C.
Reaction time: 20 min
Shower head: (surface size: 60.0 mm×16.7 mm, jetting port diameter: 0.4 mm, number of jetting ports: 17 row×6 each column at equivalent pitch).

Valve 58 is opened and valves 51 to 57 are closed in the initial state.

The shower head 42 was disposed above the substrate 11 being spaced apart by 6 mm from the catalyst deposition film forming surface 11a.

After heating the inside of the reaction chamber 32 to 750° C., valves 53, 54, and 57 were opened while maintaining the state at 750° C., and a gas mixture of the atmospheric gas (100 sccm) and the reducing gas (900 sccm) (total feed rate 1000 sccm) was fed from the second supply pipe 39 to the inside of the reaction chamber 32.

The synthesis substrate 11 previously deposited with the catalyst deposition film by sputtering vapor deposition in a separated step was entered being placed on the substrate holder 41 into the reaction chamber and disposed at the downstream 3 cm from the center in the axial direction of the reaction chamber 32 and left as it was for a predetermined time (6 min). By the operations described above, the metal catalyst at the catalyst deposition film forming surface 11a was finely particulated and conditioned to a state adaptable as the catalyst for growing a single-walled CNT.

Then, the valve 57 was dosed to stop the supply of the gas from the second supply pipe 39 and, at the same time, the valve 54 is closed to stop the supply of the reducing gas.

At the same time as the closure of the valves 57, 54, the feed rate of the atmospheric gas was lowered to 85 sccm, and the valves 51, 52, 55, 56 were opened simultaneously, by which the starting material gas (feed rate 10 sccm) and the catalyst activating substance mixed with the carrier gas (helium) (relative humidity: 23%: feed rate 5 sccm) were fed from the first gas supply pipe 37 together with the atmospheric gas, and they were blown from the jetting ports of the shower head 42 to the catalyst deposition film forming surface 11a of the substrate 11.

By the step described above, the starting material gas was thermally decomposed by the fine catalyst particles and CNT was synthesized to obtain a CNT film comprising a plurality of CNTs grown vertically from the metal catalyst on the synthesis substrate 11 in this embodiment, a CNT film of 2 μm width, 1.5 mm length (size according to the metal catalyst pattern) and 900 μm height was obtained.

While the properties of the CNT film as an alignment assembly of single-walled CNTs and the aligned CNT film aggregate produced in this example to be described later depend on details of production conditions, and typical values of production conditions of the example described above include density: 0.03 g/cm$^3$. BET-specific surface area: 1200 m$^2$/g, average outer diameter 2.5 nm, half-value width: 2 nm, carbon purity: 99.9%, and Herman's Orientation Factor: 0.6. Further, the CNT film can maintain the integrity thereof even after peeling from the substrate.

Then, the synthesis substrate 11 with the CNT film was set so as to be entered in the view field of a stereomicroscope and the CNT film 12 was detached directly by tweezers from the synthesis substrate 11 under observation by the stereomicroscope.

Then, a wafer substrate, for example, made of silicon different from the synthesis substrate 11 was prepared, isopropanol (hereinafter simply referred to as IPA) was dropped onto the wafer substrate 2 by using a commercial Pasteur pipette to prepare a liquid reservoir which was placed under the view field of the stereomicroscope (synthesis substrate 11 and wafer substrate 2 may be set simultaneously to the stereomicroscope used in the film detaching step). Then, the CNT film 12 held by the tweezers in the CNT film detaching step was immersed in IPA such that the film surface was in parallel with the wafer substrate surface. In this case, the position and the form were finely adjusted by using a PTFE paper filter attached to the tweezers.

Then, IPA to which the CNT film 12 was immersed was evaporated by spontaneous drying. The time required for drying was 5 min.

Figure 7:
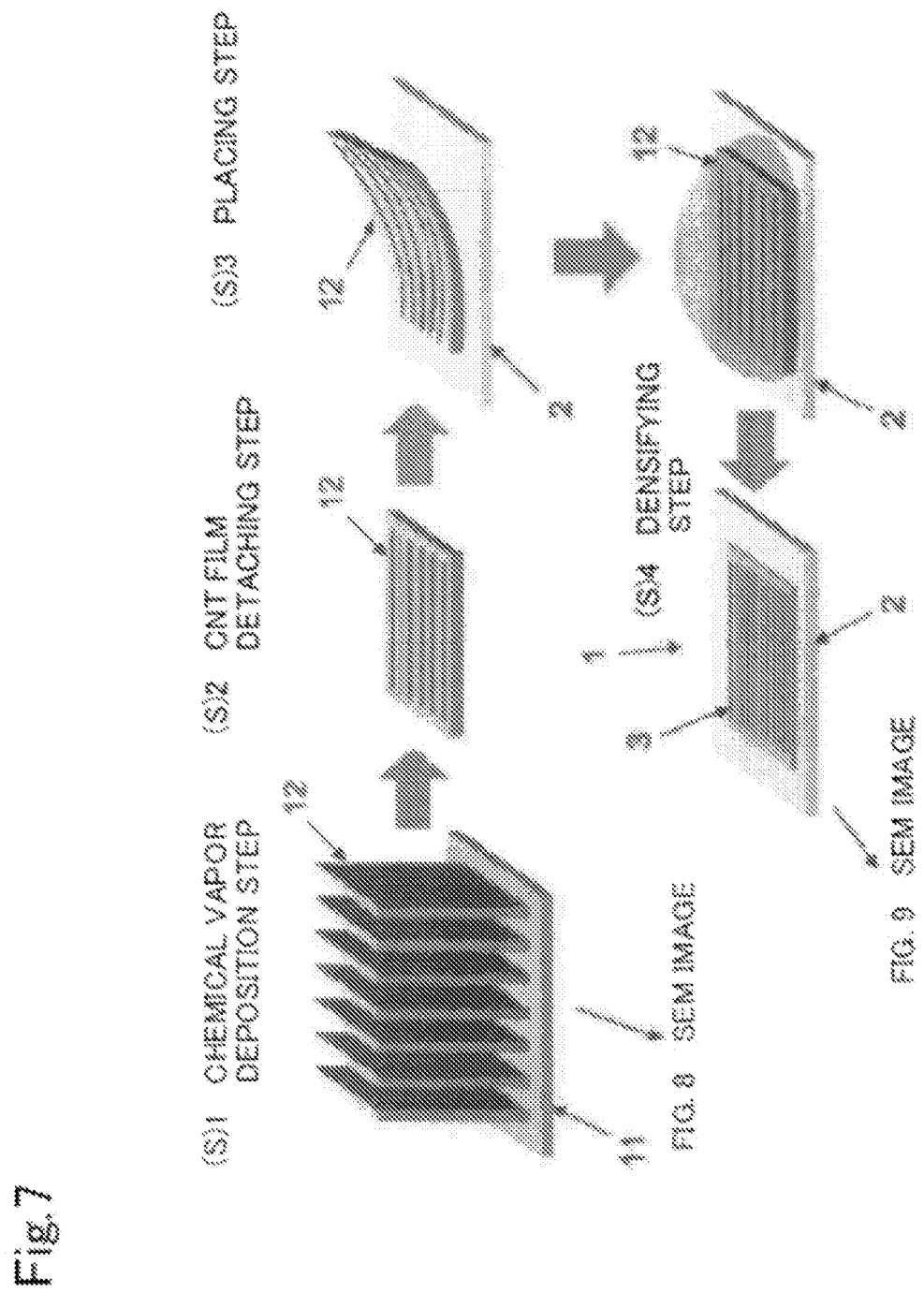
FIG. 7 is an explanatory view schematically showing a portion of a production step for a CNT film structure according to an embodiment of the invention.

The CNT film 12 having 2 μm thickness, 1.5 mm width, 900 μm length before immersion in the liquid was formed by the densifying step into a CNT layer (reference numeral 3 in FIG. 7) having 190 nm thickness, 1.5 mm width, and 900 μm length. The shrinkage in this step was 9.5%.

The CNT layer 3 in this embodiment had a thickness of 190 nm, a CNT weight density of 0.3 g/cm$^3$, a CNT number density of 4.3×10$^{12}$ CNTs/cm$^2$, a Vickers hardness of 7 Hv, a specific surface area of 1000 m$^2$/g, and a purity of 99.98%.

Similar result was obtained also by changing the liquid in which the CNT film 12 was immersed to alcohols other than IPA, acetones (acetone), hexane, toluene, cyclohexane, and DMF.

The detaching operation of the CNT film 12 from the synthesis substrate 11 could be conducted in the same manner by detaching the film directly with tweezers or tweezers attached with PTFE paper filter and there was no difference for the obtained products.

Then, the CNT film structure of the invention will be described in more detail.

The CNT film structure means a carbon nanotube aggregate formed by depositing, on a substrate, a CNT layer comprising a plurality of CNTs aligned continuously in one identical direction along the plane of a CNT film and having a high density and a uniform thickness, and the weight density is 0.1 g/cm$^3$ or more and 1.5 g/cm$^3$ or less. In a case where the weight density is less than the range described above, a resist for pattering passes through the CNT aggregate. Preferred are those applied with treatments for suppressing creasings that cause partial raise of the film structure from the substrate, bursting and breakage, densification of the carbon nanotube film in the direction other than the direction of the radial line to the substrate, and warp that causes warp of the CNT film structure upon coating of the resist to the CNT film structure.

"The aligned state of CNTs in a densified state" means a state where the Herman's Orientation Factor (Herman's Orientation Factor) is 0.6 or more and, preferably, 0.7 or more. For the CNT film structure for placement, the Herman's Orientation Factor may be 0.6 or more and, preferably, 0.7 or more irrespective of the densifying treatment.

"The state where the position of the CNT film structure is controlled" means a state where the CNT film is placed in a desired region on the substrate required for the CNT film structure. Further, "the state where the alignment of the CNT film structure is controlled" means a state where the CNT film structure is directed to an alignment direction required for the CNT film structure within an allowable range. Further, "the state with no warp in the CNT film structure" means a state where each of CNTs of the CNT film is present within an allowable range for vertical direction in a desired region on the substrate required for the CNT film structure.

A process for producing the CNT film structure according to the Invention is to be described specifically with reference to a block diagram (FIG. 10) showing the production steps thereof.

Figure 6:
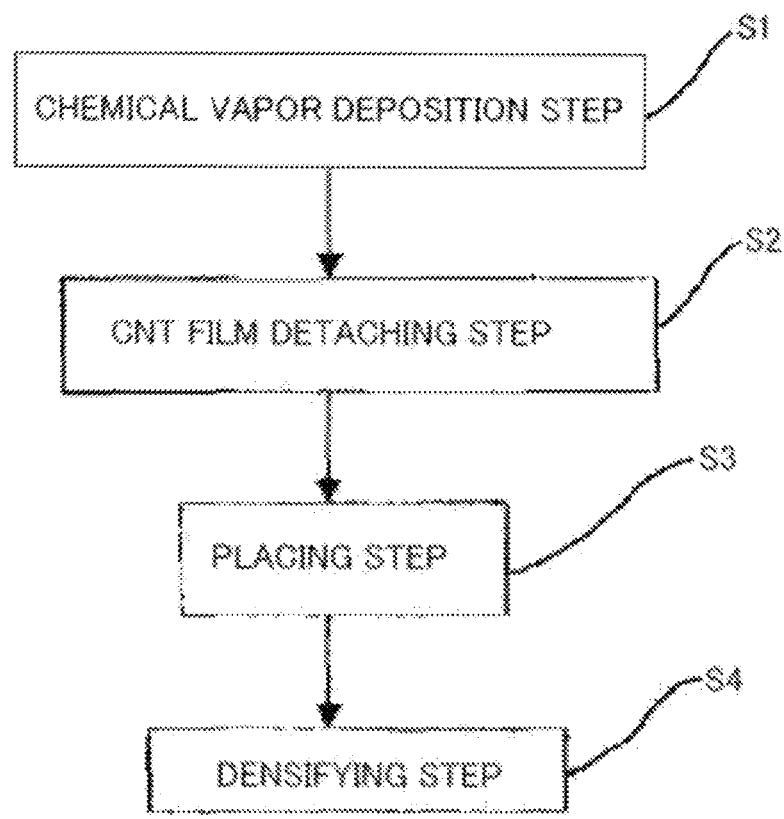
FIG. 6 is a block diagram showing a production step of a CNT film structure according to an embodiment of the invention.

At first, a CNT film is prepared in a chemical vapor deposition step (step S1 in FIG. 6). In this embodiment, a CNT film was prepared by applying a method of growing a great amount of vertically aligned CNTs while incorporating a water content, etc. as a catalyst activating substance in a reaction atmosphere (refer to Kenji Hara, et al., Water-Assisted Highly Efficient Synthesis of Impurity-Free Single-Walled Carbon Nanotube, SCIENCE, 2004. 11. 19., vol. 306, p. 1362 to 1364).

The metal catalyst for growing the CNTs in the CVD method can be formed by using appropriate metals having a result used so far in the production of CNTs and using a well-known deposition technique. Typically, they can include a metal thin film deposited by a sputtering vapor deposition method using a mask, for example, thin iron film, thin iron chloride film, thin iron-molybdenum film, thin alumina-iron film, thin alumina-cobalt film, thin alumina-iron-molybdenum film, etc.

As the synthesis substrate supporting the metal catalyst, various materials well-known so far can be used, and flat surface sheet materials or plate materials comprising metals such as iron, nickel and chromium, and metal oxides, non-metals such as silicon, quartz and glass, or ceramics can be used typically.

The shape of the metal catalyst pattern may be a continuous linear pattern or a broken line pattern having a plurality of lines arranged along one direction. Further, the thickness of the metal catalyst may be determined to an optimal value depending on the metal used as the catalyst. It is preferably 0.1 nm or more and 100 nm or less in a case of using, for example, an iron metal. Then, the width may be determined in accordance with a required thickness of the CNT layer 3 finally deposited to the substrate 2 and it may be determined to a value about 5 to 20 times the thickness of the CNT layer 3 after densification.

When the catalyst is patterned, the growth of CNTs is worsened. In a case where the catalyst pattern shape is a linear pattern, there were such problems that the growth was worsened (height is not obtainable), height unevenness increases, the growth occurs only at the central portion not at the periphery, etc. as the line is thinner.

In order to solve the problems, the iron catalyst is laminated to a thickness somewhat thicker than usual (about 1.2 to 2 nm). In ethylene tuning (ethylene was decreased, 10 sccm). The growth was conducted while decreasing to 10 sccm from 20 sccm at the initial state and, correspondingly, X was tuned severely.

The thickness of the CNT film decided by the width of the metal catalyst pattern is important in for controlling not only the thickness of the CNT layer after the densification but also the weight density of the CNT layer after the densification. By controlling the CNT thickness (original thickness) before densification (just after synthesis), the weight density of the CNTs can be controlled from 0.11 g/cm$^3$ to 0.54 g/cm$^3$ (the relation between the original thickness and the thickness after the densification, and the density will be described later).

For the carbon compound as the starting carbon source in the CVD method, hydrocarbons, among all, lower hydrocarbons, for example, methane, ethane, propane, ethylene, propylene, and acetylene can be used preferably in the same manner as in usual.

The reaction atmospheric gas may be any gas which is not reactive with CNT and inert at the growth temperature and may include, for example, helium, argon, hydrogen, nitrogen, neon, krypton, carbon dioxide, and chlorine, as well as a mixture of such gases.

The catalyst activating substance to be in contact, together with the starting material gas, with a metal catalyst film on the synthesis substrate may be any substance having a function of removing carbonaceous impurities that deposit to fine catalyst particles to deactivate the catalyst during synthesis of CNTs thereby cleaning the texture of the catalyst and generally may be any material containing oxygen and not damaging the CNTs at the growth temperature. Use of water vapor, as well as oxygen-containing compounds having less number of carbon atoms, for example, alcohols such as methanol and ethanol, ethers such as tetrahydrofuran, ketones such as acetone, aldehydros, acids, esters, nitrogen oxides, carbon monoxide, and carbon dioxide is possible depending on the reaction conditions.

Prior to the supply of the starting material gas, it is preferred to mix a reduction gas with the atmospheric gas and contact them to the metal catalyst film for a predetermined time. Thus, a metal catalyst present in the metal catalyst film is finely particulated and the metal catalyst is conditioned to a state suitable to the growth, for example, of single-walled CNTs. By appropriately selecting the thickness of the metal catalyst film and the reduction reaction conditions, fine catalyst particles of several nanometer diameter can be adjusted to a density of $1.0 \times 10^{11}$ to $1.0 \times 10^{13}$ (CNTs/cm$^2$). The density is suitable to the growing of a plurality of CNTs aligned in a direction perpendicular to the catalyst film forming surface of the substrate. The reduction gas may be any gas that can act on the metal catalyst and promote fine particulation in a state suitable to the growing of the CNTs and, for example, a hydrogen gas, ammonium, or a gas mixture thereof can be used.

The atmospheric pressure for the reaction is applicable so long as it is within a pressure range where CNTs have been produced so far and can be determined to an appropriate value within a range, for example, from $10^2$ Pa to $10^7$ Pa.

The temperature upon the growth reaction in the CVD method is determined properly while taking the reaction pressure, the metal catalyst, and the starting carbon source, etc. into consideration and CNTs can be grown preferably within a range usually from 400 to 1200° C. and, more preferably, from 600 to 1000° C.

Figure 8:
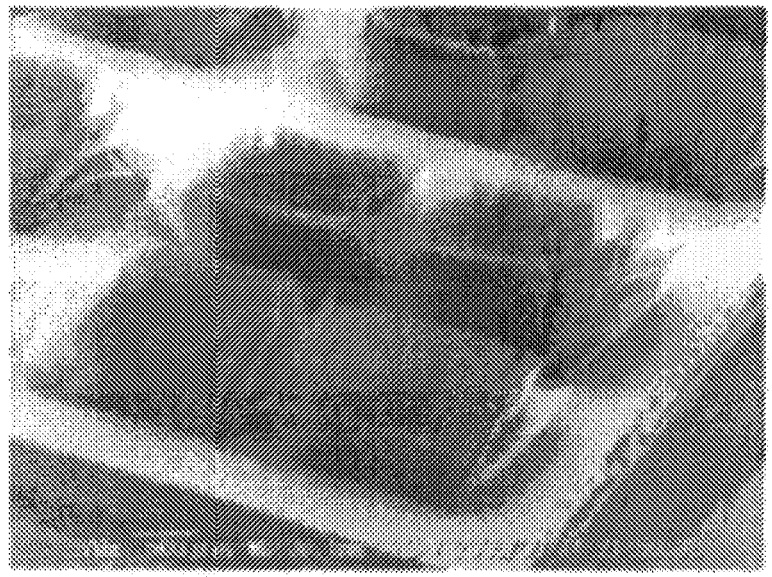
FIG. 8 is a scanning electron microscope (SEM) photographic image showing the state of a CNT film before dipping into a liquid.

The state of the CNT film synthesized on the substrate as described above is shown by scanning electron microscope (SEM) photographic image in FIG. 8. The CNTs constituting the CNT film had a purity of 98 mass % or higher, a weight density of about 0.029 g/cm$^3$, a specific surface area of from 600 to 1300 m$^2$/g (not opened)/1600 to 2500 m$^2$/g (opened).

In the invention, other production processes other than the production process described in the documents described above can be utilized. As the technique for obtaining a vertically oriented CNT assembly, there has been known, for example, "Growth of vertically aligned single-walled carbon nanotube films on quartz substrates and their optical anisotropy" (Y. Murakami, et al., Chemical Physics Letters, 385 (2004) 298-303), or (Ultra-high-yield growth of vertical single-walled carbon nanotubes: Hidden roles of hydrogen and oxygen" (Guangyu Zhang, et al., PNAS Nov. 8, 2005, vol. 102, No. 45, 16141-16145).

Then, in the subsequent CNT film detaching step (step S2 in FIG. 6), a CNT film 12 formed on a synthesis substrate 11 is detached from the synthesis substrate 11 and the step can be attained properly by an operator while selecting from a method of gripping the CNT film 12 formed on the synthesis substrate 11 by tweezers and detaching the same directly or a method of bonding a membrane made of a synthetic resin to the top end of tweezers and detaching the CNT film 12 while adhering the same to the membrane depending on the situation. When the method of using the membrane is adopted, since the area of contact with the CNT film 12 is increased, the CNT film 12 can be gripped easily and this can decrease the effect of trembling of the operator's hands on the operation during delicate operation. In this case, while a PTFE paper filter can be used suitably as the membrane, those other than the PTFE paper filter can also be used so long as they have the advantage described above.

In the detachment step, it may be sometimes difficult to take out the CNTs from the densely gathered CNT film group. Further, it may be sometimes difficult to separate the taken out CNT films one by one.

The problem can be solved by using a stereomicroscope and a membrane filter, attaching the CNT film to the membrane filter and taking out the CNTs from the CNT film group while observing under the stereomicroscope. Further, while CNTs taken out by the membrane filter may comprise one or plurality sheets depending on the case, the CNTs can be taken out sheet by sheet by the membrane filter according to the invention.

Further, with the stereomicroscope and the tweezers and with the thickness of the CNT film to be synthesized of 2 μm or more, a single sheet of the CNT film can be taken out by the tweezers.

In the next placing step (step S3 in FIG. 6), the CNT film 12 detached in the detaching step is placed on the wafer substrate 2, and the CNT film 12 is exposed to a liquid. Also for the step, there are several methods that can be selected optionally by an operator depending on the case.

In the first method, the CNT film 12 detached in the detaching step is transferred to a wafer substrate 2 to which a liquid is previously dropped and then detached from the tweezers. Subsequently, the CNT film 12 is aligned to an optional position in the liquid by tweezers attached with a membrane.

In the second method, after transferring the CNT film 12 onto the wafer substrate 2 and detaching the film from the tweezers 13, a liquid is dropped so as to dip the CNT film 12 on the wafer substrate 2 and the CNT film 12 in the liquid is positioned by the tweezers with the membrane.

While an example of placing a single CNT film 12 on the wafer substrate 2 is shown, a plurality of CNT films 12 may be placed in slack as described above. Further, the CNT film 12 may be exposed to the liquid at a place other than the wafer substrate 2.

As the liquid for exposing the CNT film 12, those having affinity with the CNTs and not containing ingredients which may remain after evaporation are used preferably. For example, water, alcohols (isopropyl alcohol, ethanol, methanol), acetones (acetone), hexane, toluene, cyclohexane, DMF (dimethylformamide), etc. can be used as such liquid. The liquid exposing time may be a time sufficient to wet the entire CNT film uniformly without leaving bubbles in the inside of the CNT film.

Then, in the densification step (step S4 in FIG. 6), the density of the CNT film 12 in a state exposed to the liquid and placed on the surface of the wafer substrate 2 is increased to form a CNT layer 3 deposited to the surface of the wafer substrate 2. The step is conducted typically by drying the CNT film 12 deposited with the liquid. For example, spontaneous drying in a nitrogen atmosphere at a room temperature, vacuum drying, heating under the presence of an inert gas such as argons, etc. can be used as the method of drying the CNT film 12.

In the densification step, when bubbles are formed to the carbon nanotube film immersed in the solution or tweezers handling the carbon nanotube, or membrane handling the carbon nanotube film upon densification, creasings may sometimes be caused upon densification. Further, it may be sometimes difficult to align the CNT film to a desired direction upon densification. Further, upon drying for densification, the solvent may sometimes remain in the densified CNT film. The problem can be overcome by reducing the thickness of the CNT film to 20 μm or less and counting the number of lamination under a stereomicroscope. Further, in a case where warp occurs even in an CNT film with a thickness of 20 μm or less, the problem can be overcome by changing the intensity of illumination in a stereomicroscope used for observation from the maximum to the minimum just before drying. This is estimated that the drying state of the CNT film is controlled thereby capable of suppressing the warp. Further, bubbling can be prevented by immersing the CNT film or the tweezers for handling the CNT film or the membrane for handing the CNT film sufficiently in the solution placed on the substrate used for densification, and observing the state by a stereomicroscope. Further, the CNT film can be arranged at a desired position and in a desired alignment by gripping the membrane filter at the top end of the tweezers, immersing them into the solution on the substrate in the same manner as for the CNT film, and moving the CNT film in the solution by manipulating the tweezers, that is, the membrane filter while observing the alignment direction of the CNT film by the microscope. Further, densification can be conducted by transferring the CNT film gripped by the tweezers to a manipulator having a top end capable of positional control, controlling and arranging the CNT film to a desired position and in a desired alignment by the manipulator, retaining the same on the substrate by the manipulator and then dripping the liquid used for the densification. The top end capable of controlling the position may be a needle-like or bar-like top end having a high degree such as tungsten or may be a top end having flexibility like a resin. Further, a jig capable of gripping such as tweezers may also be utilized as the top end. Further, as a solution used for densification capable of effectively preventing warp, while methanol is used preferably, this is judged depending on the case.

Upon drying, alignment of CNTs can be adjusted to a desired one direction by drying while changing the illumination intensity of the stereomicroscope from the maximum to the minimum just before drying. Further, according to the method, even in a case where a micro structure is already present as an underlying layer, the CNT films at or after the second layer can be placed without sweeping the CNT film of the micro structure. The manipulator may be detached after drying. Further, a method of keeping it in vacuum at 180° C. for 10 min before used in the subsequent process is also preferred.

When the CNT film 12 is immersed in the liquid, the entire volume shrinks somewhat by close adhesion of CNTs to each other, the adhesion degree is further enhanced upon evaporation of the liquid, so that the volume is considerably reduced and, as a result, highly densified CNT layer 3 is formed. In this case, it scarcely causes areal shrinkage at the surface in parallel with the wafer substrate 2 due to the contact resistance with the wafer substrate 2 and shrinkage occur exclusively in the direction of the thickness of the CNT layer 3.

Figure 9:
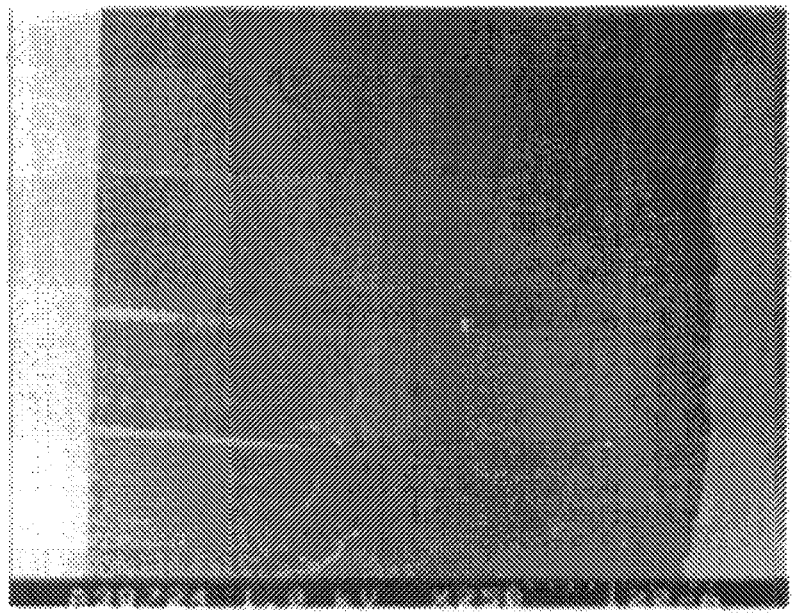
FIG. 9 is an electron microscope photographic image showing an example of a CNT film structure produced according to the invention.

By way of each of the steps described above, a CNT film structure 1 deposited with a high density CNT layer 3 aligned in one direction parallel to the surface of the wafer substrate 2 is completed. An example of the CNT film structure 1 produced as described above is shown by a scanning electron microscope (SEM) photographic image in FIG. 9. As shown in FIG. 10(b), the thus obtained CNT layer 3 does not lose the alignment properly thereof due to the densification compared with the CNT film 12 just after detachment from the synthesis substrate 11 (FIG. 10(a)). It can be seen that the CNT layer 3 after the densification has a sufficient anisotropy as viewed from the result of measurement for the dependence of Raman G-band intensity shown in FIG. 10(c).

While the method of drying the CNT film 12 after exposing to the liquid was adopted in the densification step, it is estimated that the mechanism of shrinking CNT film 12 in the densification step is caused because each of the CNTs is attracted to each other by the surface tension of the liquid intruding between each of the CNTs and a state where each of the CNTs are adhered to each other is maintained also after the evaporation of the liquid. Accordingly, the densification step may adopt any method of causing surface tension between CNTs to each other and, for example, a method of using high temperature steams can also be applied.

Figure 27:
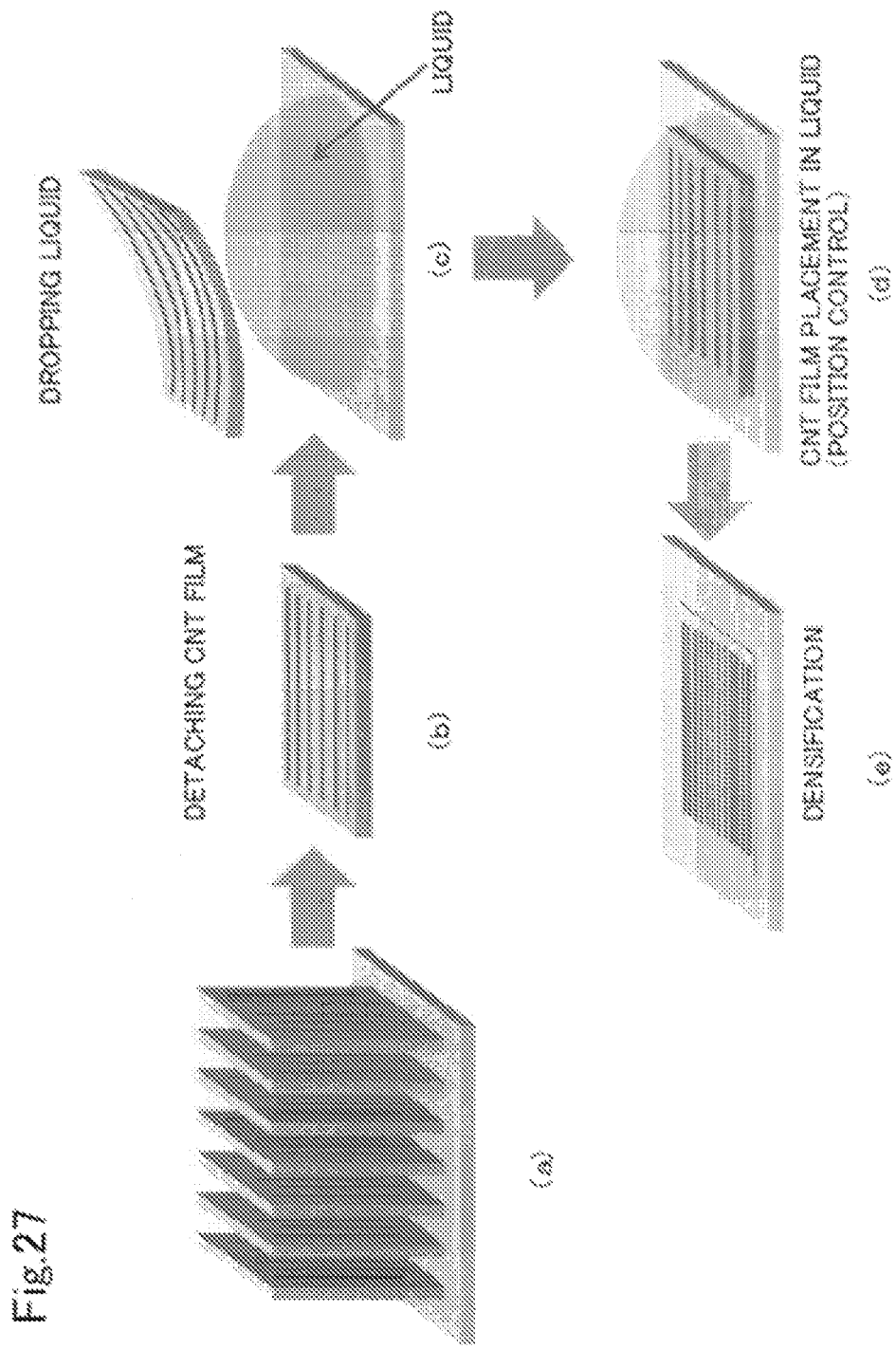
FIG. 27 is an explanatory view of a CNT placing method.
Figure 28:
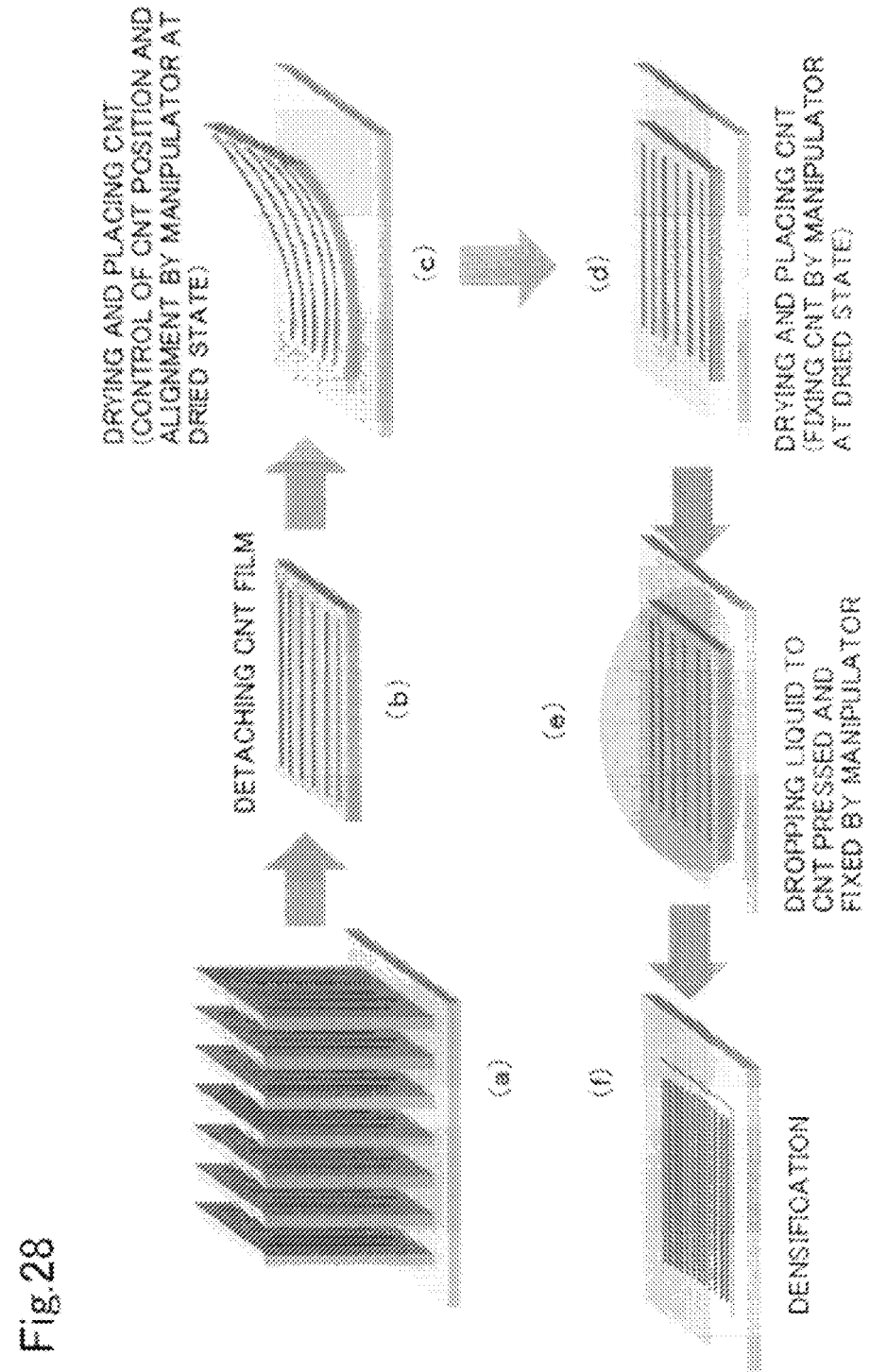
FIG. 28 is an explanatory view of a CNT placing method.

Further, a process for producing a CNT film structure will be described in detail with reference to FIG. 27 and FIG. 28 (only one layer of carbon nanotube film).

At first, a process for producing a CNT film structure with only one CNT film layer will be described in detail with reference to FIG. 27.

CNT Growing Step (a)

A CNT film group formed by growing aligned CNT films about at a thickness of 8 µm, 4 µm, 2 µm, 1 µm or 0.5 µm, a width of 1.5 mm (catalyst coating area), and a height of 500 µm (axial direction of CNT) as a group of one or more sheets for each thickness is grown on the substrate.

CNT Film Detaching Step (b)

A membrane made of a synthetic resin is gripped or attached to tweezers, and the membrane is processed. It is preferred that a sufficient contact area is obtainable for the processed membrane when it is brought into contact with the CNT film and it may be either larger or smaller than the CNT film. In this case, while a PTFE paper filter can be used suitably as the membrane, other materials than the PTFE paper filter can also be used so long as the CNT film can be attached thereto upon contact. A CNT film of a thickness suitable to the experiment is selected from the CNT film group. Then, the membrane treated as described above is fitted to the CNT film at the extreme end of the selected CNT film group and the CNT film is transferred to the membrane. In a case where a desired thickness cannot be obtained, the taken out CNT film is attached to a both face tape, and peeled from the membrane, and the operation described above is repeated.

CNT Film Placing; Fixing Steps (c, d)

An IPA solution is dropped to the substrate for placement to form a liquid droplet on the surface into which a carbon nanotube film is immersed together with the membrane under the observation by a stereomicroscope. Upon evaporation of IPA, the membrane is moved while observing by the stereomicroscope to control the placing position and the alignment direction of the CNT film. While the CNT film usually waves when immersed in the solution, it is observed till a state where the solution is evaporated and the film is no more movable and the change of the placing position and the alignment position along with the evaporation of the solution is controlled. When the IPA solution is evaporated to decrease the amount of liquid and the CNT film is no more movable, the surface of the CNT film is observed and it is dried till the solution is evaporated and the surface of the CNT becomes visible.

Drying Step (e)

For conducting drying sufficiently, drying is conducted in vacuum at 180° C. for 10 min before coating of a resist.

Then, another process for producing a CNT film structure with only one CNT film layer will be described in detail with reference to FIG. 28.

CNT Growing Step (a)

A CNT film group formed by growing aligned CNT films about at a thickness of 8 µm, 4 µm, 2 µm, 1 µm or 0.5 µm, a width of 1.5 mm (catalyst coating area), and a height of 500 µm (axial direction of CNT) as a group on one of more sheets for each thickness is grown on the substrate (one group comprising CNT films of an identical thickness at an identical distance in all cases).

A membrane made of a synthetic resin is gripped or attached to tweezers, and the membrane is processed. It is preferred that a sufficient contact area is obtainable for the processed membrane when it is brought into contact with the CNT film and it may be either larger or smaller than the CNT film. In this case, while a PTFE paper filter can be used suitably as the membrane, other materials than the PTFE paper filter can also be used so long as the CNT film can be bonded thereto upon contact.

CNT Film Detaching Step (b)

A CNT film of a thickness suitable to the experiment is selected from the CNT film group. Only one sheet of CNT film is gripped by the tweezers under a stereomicroscope (this is possible in a case where the thickness is 2 µm or more) and taken out from the substrate (in a case of taking out two or more sheets from the substrate, only one of them is taken out by using two tweezers under the stereomicroscope).

Then, an IPA solution is dropped to the substrate for placement to form a liquid droplet on the surface into which a CNT film is immersed together with the tweezers under the observation by the stereomicroscope, and the CNT film is detached from the tweezers and caused to wave in the liquid.

Upon evaporation of IPA, the membrane is immersed and moved in the solution while observing by the stereomicroscope to control the placing position and the alignment direction of the CNT film. While the CNT film usually waves when immersed in the solution, it is observed till a state where the solution is evaporated and the film is no more movable and the change of the placing position and the alignment position along with the evaporation of the solution is controlled.

When the IPA solution is evaporated to decrease the amount of liquid and the CNT film is no more movable, the surface of the CNT film is observed and it is dried while changing the intensity of the light used for observation from the maximum to the minimum when the surface of the CNT becomes visible.

Drying Step

For conducting drying sufficiently, drying is conducted in vacuum at 180° C. for 10 min before coating of a resist.

Then, a further process for producing a CNT film structure with only one CNT film layer will be described in detail with reference to FIG. 28.

A CNT film group formed by growing aligned CNT films about at a thickness of 8 µm, 4 µm, 2 µm, 1 µm or 0.5 µm, a width of 1.5 mm (catalyst coating area), and a height of 500 µm (axial direction of CNT) as a means of on one or more sheets for each thickness is grown on the substrate (one group comprising CNT films of an identical thickness at an identical distance in all cases).

Then, a membrane made of a synthetic resin is gripped or attached to tweezers and the membrane is processed. It is preferred that a sufficient contact area may be obtainable for the processed membrane when it is brought into contact with the CNT film and it may be either larger or smaller than the CNT film. In this case, while a PTFE paper filter can be used suitably as the membrane, other materials than the PTFE paper filter can also be used so long as the CNT film can be attached thereto upon contact.

A CNT film of a thickness suitable to the experiment is selected from the CNT film group described above. Then, only one sheet of CNT film is gripped by the tweezers under the stereomicroscope (this is possible for a case of a thickness of 2 µm or more) and taken out from the substrate (in a case of taking out two or more sheets from the substrate, only one of them is taken out by two tweezers under the stereomicroscope).

Then, the CNT film taken as described above is transferred to the needle tip of a manipulator having a hard needle. In addition to the manipulator described above, a manipulator having a soft needle tip is used and the CNT film is placed at a desired position in a desired alignment on the substrate by manipulating the two manipulators. Upon placement, both ends of the CNT film are pressed against the substrate by two needles of the manipulators. In this case, for preventing the breakage of the CNT film caused by the needle pressing strongly, a contact point between the substrate and the needle is adjusted before attaching of the substrate to the needle and previously adjusted such that the needle does not press the substrate exceeding the contact point.

Methanol is dropped by one droplet using a Pasteur pipette from above the CNT film pressed by two needles on the substrate at the desired position and in the desired alignment described above, and density is increased while observing the surface by a stereomicroscope. When the dried state of the surface is observed by the stereomicroscope and the surface of the CNT becomes visible, drying is conducted while changing the intensity of the light used for observation from the maximum to the minimum.

After the completion of the drying, the two needles pressing the CNT film are raised upward to release pressing. For conducting drying sufficiently, drying is conducted in vacuum at 180° C. for 10 min before coating of a resist.

A vertically aligned CNT film 12 was prepared on the synthesis substrate 11 in the same manner as in the example described above except for changing the width of the metal catalyst to 4 µm in the example described above. Then, a CNT film structure 1 was produced by way of the same steps as in the example described above. By the process, while the CNT film 12 before immersing in the liquid had a thickness: 4 µm, a width: 1.5 mm, and a length: 900 µm, the CNT layer 3 after the densification step had a thickness: 250 nm, a width: 1.5 mm, and a length: 900 µm in which the shrinkage was 6.3% and the weight density was 0.47 g/cm$^3$.

A vertically aligned CNT film 12 was prepared on the synthesis substrate 11 in the same manner as in the example described above except for changing the width of the metal catalyst to 7.5 µm in the example described above. Then, a CNT film structure 1 was prepared by way of the same steps as in the example described above. By the process, while the CNT film 12 before immersing in the liquid had a thickness: 7.5 µm, a width: 1.5 mm, and a length: 900 µm, the CNT layer 3 after the densification step had a thickness: 470 nm, a width: 1.5 mm, and a length 900 µm in which the shrinkage was 6.3% and the weight density was 0.47 g/cm$^3$.

Further, a process for producing a CNT film structure in which a plurality of CNT layers are laminated on the substrate will be described below.

A vertically aligned CNT film was formed on a synthesis substrate in the same manner as in Example 1 except for changing the width of the metal catalyst film to 8 µm. Then, a CNT film structure having a CNT layer at the first layer was produced by way of the placing step and the densification step in the same manner as in Example 1. Further, a liquid reservoir of IPA was formed to the CNT film structure in the same manner as in Example 1, in which a second sheet of CNT film was immersed in the direction perpendicular to the alignment direction or in the identical direction with the CNT layer at the first layer and dried spontaneously. FIG. 17(a) is an electron microscope photographic image showing a state where two CNT films are stacked to each other while crossing the alignment directions thereof to each other and FIG. 17(b) is an electron microscope photographic image where two CNT films are stacked with the alignment direction thereof being identical. Lines extending rightward and leftward which appears black in the central portion of FIG. 17(b) are a joint of overlap.

The thickness of the CNT film before immersing in the liquid is 8 µm for the first sheet and 8 µm for the second sheet, and the thickness of the CNT layer after densification was 574 nm for the first layer and 580 nm for the second layer, the shrinkage thereof was 7.2% for the first layer and 7.3% for the second layer, and the weight density thereof was 0.41 g/cm$^3$ for the first layer and 0.41 g/cm$^3$ for the second layer.

Hereinafter, the CNT micro structure of the invention will be described in detail.

The CNT micro structure means a carbon nanotube aggregate formed by depositing, on a substrata, a CNT layer comprising a plurality of CNTs aligned continuously at a desired position with a desired size and having high density and uniform thickness, in which the Herman's Orientation Factor of the assembly is 0.7 or more. The desired position means a state of provision at a position requiring the function of CNT on an optional substrate and the desired size means a size required for the development of the function. The function of the CNT is the function of utilizing the property of the CNT, that is, electric property, mechanical property, magnetic property, and gas adsorption property. Other properties concerning the physical property of the CNT also correspond thereto.

Figure 29:
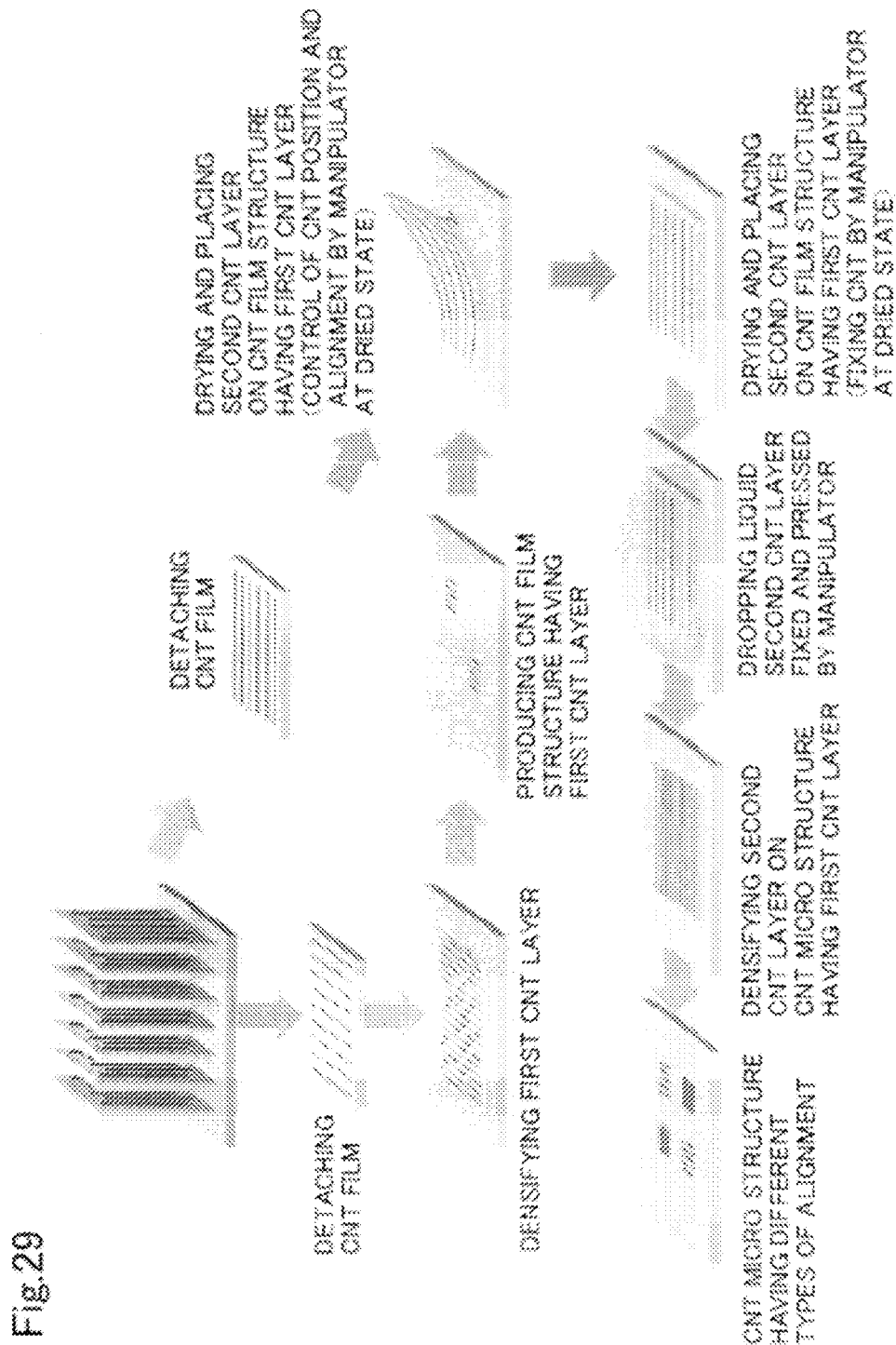
FIG. 29 is an explanatory view of a CNT placing method.
Figure 30:
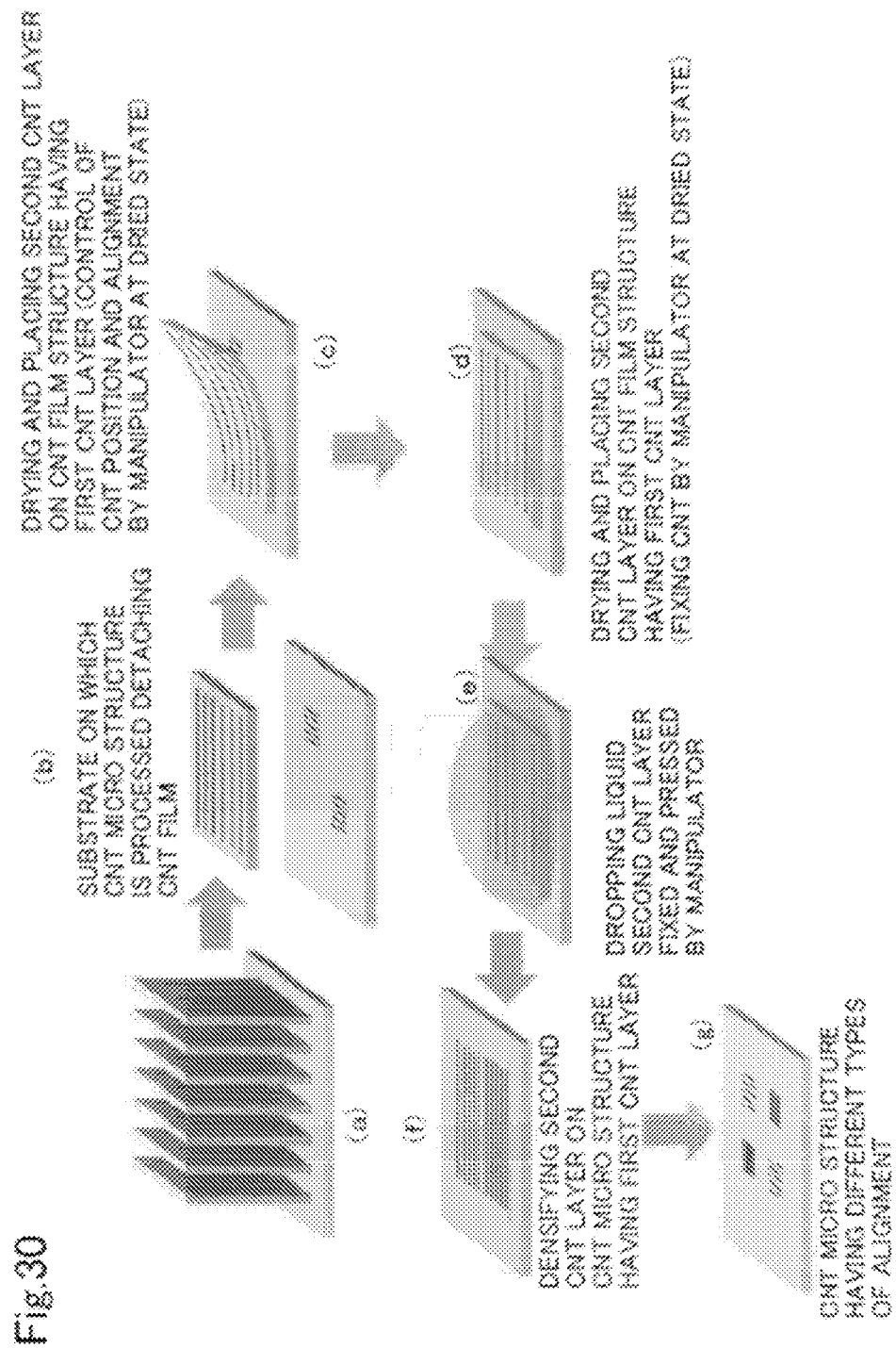
FIG. 30 is an explanatory view of a CNT placing method.

The CNT micro structure will be described in detail with reference to FIG. 29 and FIG. 30.

A CNT film structure at the first layer is produced by using a process for producing the CNT film structure described above. For sufficiently drying the CNT film structure, drying is conducted in vacuum at 180° C. for 10 min before resist coating. A solution formed by diluting resist PMMA 495 with a liquid diluent by five times on the weight basis was coated, spin-coated at 4,700 rpm for one min, and baked at 180° C. for one min to form an auxiliary resist layer. This suppressed the main resist at the second layer from penetrating into the densified CNT film. The auxiliary resist layer may be any material so long as it has a function of suppressing the main resist layer at the second layer from penetrating into the CNT film structure and capable of being etched in the same manner as the CNT film structure and, for example, ZEP-520A or AZP-1357. The liquid diluent may be any material so long as it can dilute the resist used as the auxiliary resist layer and the dilution amount, coating method, and baking condition are not restricted so long as the dilution amount is within a range capable of drawing the main resist at the second layer.

FOX16 was further coated as the main resist at the second layer and spin coated at 4,500 rpm for one min to form a 360 nm resist layer.

Then, a predetermined pattern was drawn to a resist layer by an electron beam drawing device (CABL8000/CRESTEC Inc.), which was developed with an aqueous solution of tetramethyl ammonium hydroxide (2.38% ZTMA-100) to form a mask of FOX16. CNT was etched on every resist by using the following condition for the CNT etching step to obtain a desired structure at a desired position to construct a CNT micro structure at the first layer having a first alignment.

A CNT film structure at a second layer was produced on the CNT micro structure obtained by the step described above, or a CNT micro structure having the same structure by the method used in the example for the process for producing the CNT film structure.

For the CNT film structure at the second layer, the CNT micro structure at the second layer having the second alignment was fabricated by using the same procedures as described above (CNT micro structure at the first layer is protected by the mask present thereover also during fabrication of CNTs at the second layer).

After the processing, it was immersed in a buffered hydrofloric acid solution till the layer of FOX16 could be removed, then immersed, in turn, in pure water, in IPA, and in Remover-PG as a PMMA removing liquid or a solution of MIBK: IPA=1:1 as a developing solution for PMMA till the remaining PMMA layer was removed. Finally, it was immersed into IPA (during the mask removing process, it was moved rapidly from the solution to the solution so as not to dry-up the specimen).

After immersing into IPA, it was dried spontaneously to construct a CNT micro structure having two or more types of alignment.

Then, a three-dimensional CNT micro structure of the invention will be described in detail.

The three-dimensional CNT micro structure means a CNT aggregate having a portion in contiguous with a surface depositing, on the substrate, a CNT layer comprising a plurality of CNTs aligned continuously at a desired position in a desired size and having high density and uniform thickness is present at a portion other than the deposited surface.

The alignment of the three-dimensional CNT micro structure means that, at least a portion of the three-dimensional CNT micro structure within one identical plane has a Herman's Orientation Factor of 0.6 or more and, more preferably, 0.7 or more.

A process for producing the three-dimensional CNT micro structure will be described below in detail.

At first, an Ni mask 26 is provided on an wafer substrate 22 comprising Si (FIG. 11(a)) and then the water substrate 22 is etched in a vertical direction, for example, by $O_2$/Ar reactive ion etching to form, for example, three pillars 23 (FIG. 11(b)). Then, an aimed three-dimensional CNT film structure 21 is obtained by way of the chemical vapor deposition step (step S1), the CNT film detaching step (step S2), the placing step (step S3), and the densification step (step S4) described in the first embodiment (FIG. 11(c)).

Then, a process for producing a three-dimensional CNT micro structure with no sacrificial layer will be described in detail.

Figure 31:
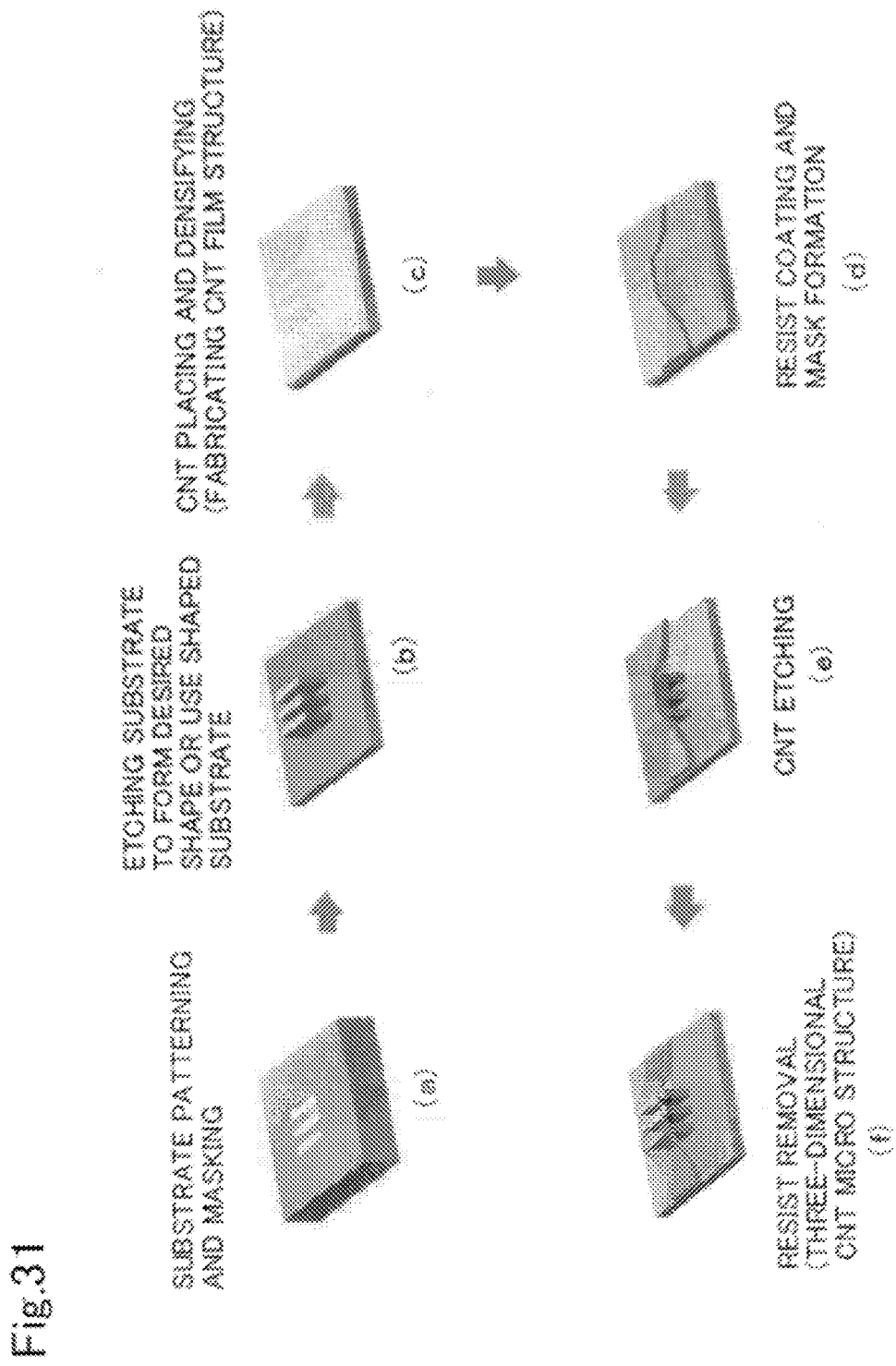
FIG. 31 is a view for explaining a method of producing a CNT micro structure without providing a sacrificial layer.

As shown in FIG. 31 (upper left portion), a substrate is patterned by a customary method to provide a mask resistant to etching conditions of the substrate. Then, the substrate is etched under predetermined etching conditions to prepare a substrate having an optional uneven shape. A substrate having the shape not by way of the process may also be utilized (upper central portion in FIG. 31). A CNT film structure is formed on the substrate having the uneven shape (FIG. 31 (upper right portion)). A resist is coated over the CNT film structure formed on the uneven shape, and a resist mask is constructed in a desired shape over a three-dimensional shape intended to be obtained as the three-dimensional CNT micro structure (FIG. 31 (lower right portion). Then, CNT is etched to process the CNT film structure so as to construct a three-dimensional CNT micro structure at the desired position and in the desired shape by the resist mask (FIG. 31 (lower central portion)). After processing the CNT film structure, the resist mask is removed, and a three-dimensional CNT micro structure is obtained at the desired position and in the desired shape (FIG. 31 (lower left portion)).

The invention is applicable also to a wafer substrate having a predetermined three dimensional portion. The example is shown below.

<Pillar Forming Step>

A silicon substrate with an oxide film of 500 nm thickness was prepared. After supersonically cleaning the surface thereof with IPA, it was cleaned by irradiation of $O_2$ plasmas at the 300 W for one min, and then a resist (ZEP-520A; manufactured by ZEON Corp.) was coated by a spin coating method using a spin coater (1H-D1 manufactured by Mikasa Co.) and baked at 150° C. for 3 min.

Then, a top face of a pillar was drawn to the resist layer by an electron beam drawing apparatus (CABL8000: CRESTEC Inc.), developed with a liquid developer (ZED-N50/ZEON Corp.), and a mask was formed to a portion other than that for forming a pillar. Then, after sputtering an Ni layer of 100 nm thickness to a portion exposed from the mask, that is, to a portion as the top face of the pillar, the resist was removed by a stripping liquid (ZOMEC/ZEON Corp.), and then rinsing was applied by IPA. As described above, a silicon substrate masked with the Ni layer for a portion of the surface was obtained.

The surface of the silicon substrate with the Ni layer mask was cleaned with $O_2$ plasmas and the silicon substrate was etched together with the oxide film using the pattern of the Ni layer as the mask by a reactive ion etching apparatus (RIE-200L/SAMCO Inc.). In this case, a gas mixture of $CHF_3$, $SF_8$, and $O_2$ ($CHF_3$; 100 W, 8.5 Pa, 40 sccm, 45 min/$SF_6$; 100 W, 8.5 Pa, 60 sccm, 45 min/$O_2$; 100 W, 8.5 Pa, 55 sccm, 45 min) was supplied to the silicon substrate having the Ni layer mask, to obtain a wafer substrate 22 in which a plurality of pillars 23 were arranged laterally and longitudinally.

Figure 13:
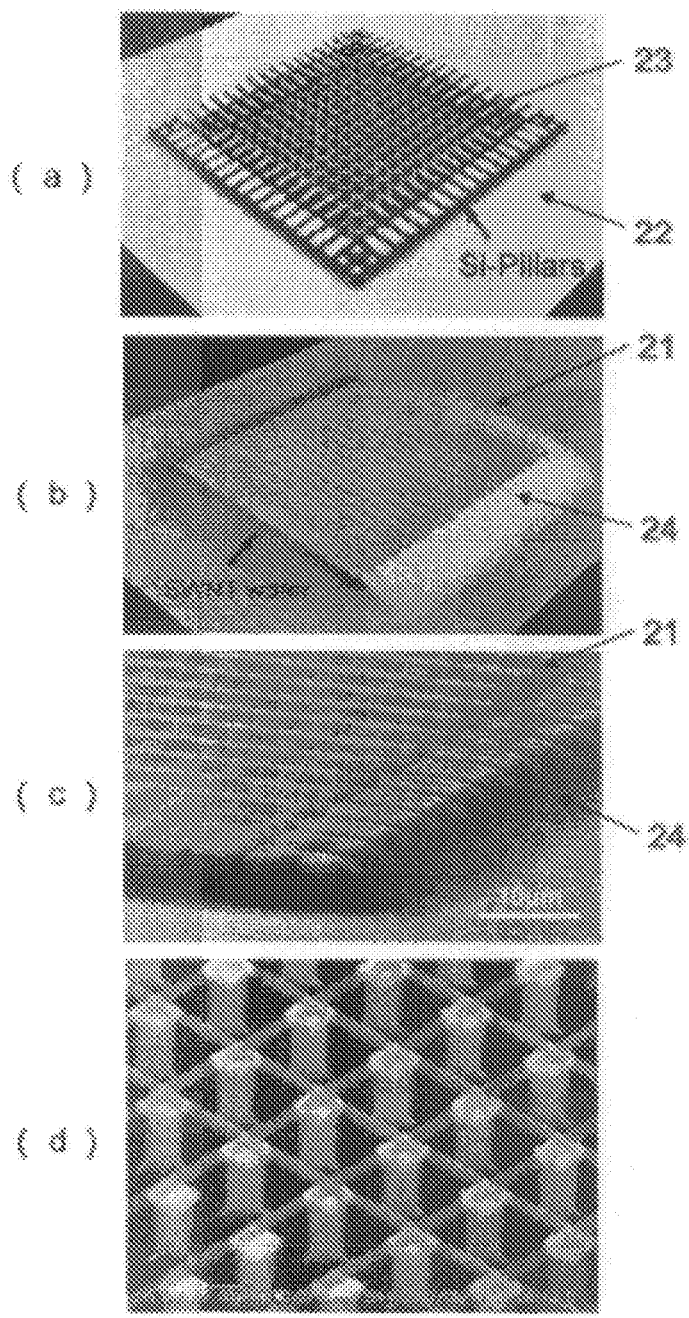

An example of a pillar group having a pillar height of 5 μm, a pillar distance of 4 μm, an area for the top face of the pillar of 2 μm×2 μm is shown in FIG. 13(d). Further, another example having a pillar height of 5 μm, a pillar distance of 10 μm, an area for the top face of the pillar for the pillar group situating on this side of 10 μm×30 μm, and an area for the top face of the pillar for the pillar group situating on the other side of 10 μm×90 μm, is shown in FIG. 14(a). Further, another example having a pillar height of 3 μm, a pillar distance of 4 μm, and an area for the top face of the pillar of 2 μm×2 μm is shown in FIG. 15(a).

<Chemical Vapor Deposition Step><Placing Step><Densifying Step>

A CNT film 12 produced by a separate step was detached from a synthesis substrate 11 by using tweezers attached with a membrane, and placed on the surface of each wafer substrate 22 formed with the pillar group as described above. They were exposed uniformly to IPA, spontaneously dried for 5 min in an atmospheric air and then further dried by baking at 180° C. for 10 min under vacuum suction. Thus, the CNT film was densified and closely adhered to the surface of the wafer substrate 22 to obtain a CNT film structure 21 formed with the densified CNT layer 24 at the surface layer. In this case, the NI layer remaining on the surface of the wafer substrate 22 further enhanced adhesion of the CNT layer. In the CNT layer 24, CNTs were aligned in the longitudinal direction of a center lever that bridges pillars adjacent with each other, and the weight density was 0.48 g/cm$^3$, the thickness was 250 nm, and the entire area was 110 μm×110 μm.

Figure 15:
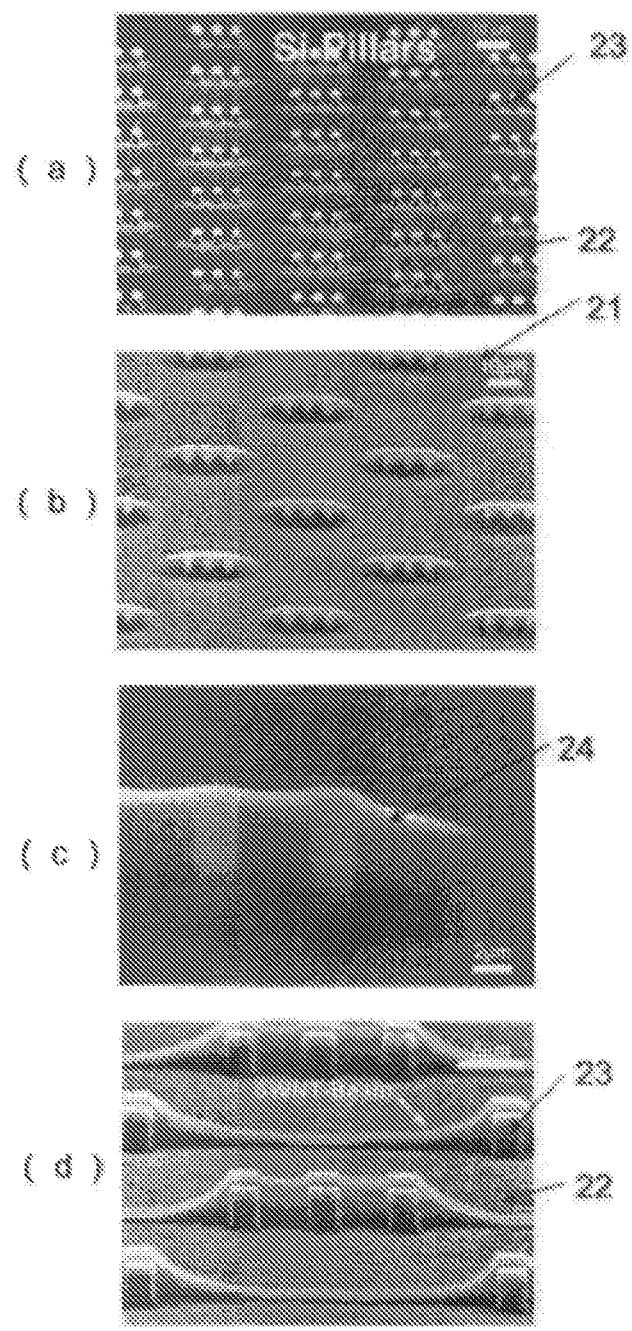

FIG. 13(a)(b)(c), FIG. 14(a), and FIG. 15(b)(c) respectively show the state where a CNT layer 24 is deposited to a wafer substrate 22.

<Patterning Step>

A CNT film structure 21 formed by depositing a CNT layer 24 to a wafer substrate 22 having pillars 23, that is, a predetermined three-dimensional shape portion can be processed by utilizing a well-known patterning technique.

Upon processing of the CNT film structure 21, a resist at the first layer (495 PMMA A 11/MicroChem diluted by five times based on the weight ratio) is coated by a spin coating method (4,700 rpm, one min), and baked on a hot plate (180° C. one min) to form an auxiliary resist layer of 80 nm. This can suppress a main resist at the second layer from penetrating into the CNT layer 24.

Then, a main resist at the second layer (FOX16/Dow Corning) was coated by the spin coating method (4500 rpm, one min) on the auxiliary resist layer and baked on the hot plate (90° C., 10 min), to form a 360 nm main resist layer.

Then, a predetermined pattern was drawn to the main resist layer by an electron beam drawing apparatus (CABL8000/CRESTEC Inc.), which was developed with an aqueous solution of tetramethyl ammonium hydroxide (2.38% ZTMA-100/ZEON Corp.) to form a mask. By the operation, a predetermined pattern is formed only to the main resist layer coated at the second layer.

At first, $O_2$ (10 sccm, 80 W, 10 Pa, 7 min) and then $O_2$ and Ar (10 sccm, 80 W, 10 Pa, 3 min) were supplied by a reactive ion etching apparatus (RIE-200L/SAMCO Inc.) to remove portions of the auxiliary resist layer at the first layer and the CNT layer 24 exposed from the mask, that is, unnecessary portions. Then, by introducing Ar, burrs of the CNTs could removed cleanly to obtain sharp edges.

Finally, the main resist layer at the second layer was removed by using a buffered hydrofloric acid (110-BHF (4.7% HF, 36.2% $NH_4F$, 59.1% $H_2O$)/MORITA CHEMICAL INDUSTRIES CO., LTD) and, after it was rinsed with pure water, and the auxiliary resist layer at the first layer was removed by a peeling solution (PG/MicroChem), cleaned with IPA and dried spontaneously to obtain an aimed product.

FIG. 13(e) is an example of forming a lattice pattern of 1 μm width conforming to pillar tops, FIG. 14(b) is an example of forming a linear beam (beam) shaped patter of 5 μm width between the top faces of pillars adjacent to each other and FIG. 15(d) is an example of forming a linear pattern continuously connecting top faces to each other of the pillar and the general surface of the wafer substrate.

Liquid chemicals and instruments used in the pillar forming step and the patterning step are not restricted to those in the example described above. Further, the size of the pillar can also be determined optionally.

Then, a process for producing a CNT micro structure provided with a sacrificial layer will be described in detail with reference to FIG. 32. An optional substrate is prepared as shown in FIG. 32 (upper left portion). A shape pattern is constructed by a material such as a resist that can be removed by some or other treatment as shown in FIG. 32 (upper central portion). Alternatively, a substrate previously formed with an uneven shape with a material removable by some or other treatment not by way of the process described above may also be utilized. Then, a CNT film structure is formed on a substrate having an uneven shape with a material removable by some or other treatment (FIG. 32 (upper right portion)). A resist is coated on the CNT film structure formed on the uneven shape and a resist mask is constructed in a desired shape on a three-dimensional shape intended to be obtained as a three-dimensional CNT micro structure on the CNT film structure present as the unevenness of the substrate.

Then, CNTs are etched and a CNT film structure is processed so as to construct a three-dimensional CNT micro structure by a resist mask at a desired position and in a desired shape (FIG. 32 (lower central portion)). After processing the CNT film structure, the unevenness portion constructed by a removable material under the resist mask and the CNTs is removed to obtain a three-dimensional CNT micro structure at a desired position and in a desired shape (FIG. 32 (lower left portion)).

In this embodiment, while the pillar 23 as a convex structure is formed by etching the wafer substrate 22, three dimensional shape of the CNT layer can be controlled also by forming a sacrificial layer of a predetermined shape to the wafer substrate before the placing step (step S3) and then removing the sacrificial layer after the densification step (step S4). In this case, the sacrificial layer may be formed by using, for example, an HSQ (hydrogen silsesquioxane) and the sacrificial layer can be removed by using a buffered hydrofloric acid but this is not restrictive.

Then, a process for producing a densified CNT layer by forming an uneven shape by a sacrificial layer will be described in detail.

The shape of the CNT layer can be controlled to an optional three dimensional structure by forming unevenness by a sacrificial layer and then removing the sacrificial layer after forming the densified CNT layer. For example, a silicon substrate having an $Si_3N_4$ layer of 200 nm thickness was prepared, and the surface was supersonically cleaned by IPA, cleaned by irradiation of $O_2$ plasmas at 300 W for one min and then dewatered by baking at 150° C. for 10 min. Then, HSQ (FOX16/Dow Corning Corp.) was coated by a spin coating method (4500 rpm, 1 min), and baked at 250° C. for 2 min to form a resist layer of 470 nm. A predetermined pattern was drawn to the resist layer by an electron beam drawing apparatus (CABL8000/CRESTEC Inc.), and then developed by an aqueous solution of tetramethyl ammonium hydroxide (2.38% ZTMA-100/ZEON Corp.) to obtain a sacrificial layer of a shape corresponding to a predetermined pattern.

A densified CNT layer can be formed on the wafer substrate having the sacrificial layer and patterned to a shape, for example, corresponding to the sacrificial layer. As the patterning method, a mask was formed by coating a resist (FOX16/Dow Corning Corp.) on a CNT layer by a spin coating method (4500 rpm, 1 min), baking the same at 90° C. for 10 min to form a resist layer of 360 nm thickness, then, drawing a predetermined pattern to the resist layer by an electron beam drawing apparatus (CABL8000/CRESTEC Inc.), and developing the same by an aqueous solution of tetramethyl ammonium hydroxide (2.38% ZTMA-100/ZEON Corp.). $O_2$ and Ar ($O_2$/Ar=10 sccm/10 sccm, 80 W, 10 Pa, 2 min) were supplied by a reactive ion etching apparatus (RIE-2000L/SAMCO Inc.) and a portion exposed from the mask of the CNT layer, that is, an unnecessary portion of the CNT layer was removed. Then, the resist layer was removed by a dry etching method of exposing the layer to vapors of 50% hydrofluoric acid for 25 min.

FIG. 16(a) shows a state in which a plurality of sacrificial layers each of 5 μm length and 1 μm width were laid over a substrate and a CNT thin film was placed so as to cover the sacrificial layers and patterned into a rectangular pattern.

The sacrificial layer (FOX16/Dow Corning Corp.) was removed with a buffered hydrofloric acid (4.7% HF, 36.2% $NH_4F$, 59.1% $H_2O$) (Morita Chemical Industries Co., Ltd.) and then cleaning was applied by IPA. Then, a CNT layer having a three dimensional structure can be formed by super critical drying by carbon dioxide to the substrate having the CNT layer and the sacrificial layer immersed in IPA by a super critical drying apparatus (Ryusho Sangyo). FIG. 16(b) shows a state of removing the sacrificial layer shown in FIG. 16(a) to form a hollow structure.

Also in this embodiment, in a plurality of CNTs forming the CNT layer 24, adjacent CNTs are intensely bonded to each other by a Van der Waals' force and the weight density thereof is 0.1 g/cm$^3$ or more and, more preferably, 0.2 g/cm$^3$ or more. In a case where the weight density of CNTs in the CNT layer 24 is at or more than the lower limit value described above, the CNT layer 24 exhibits a rigid form as a solid body and a necessary mechanical strength (rigidity, bending property, etc.) can be obtained. Generally, while a higher weight density of CNTs is more preferred for the CNT layer 24, the upper limit value is about 1.5 g/cm$^3$ in view of restriction in production.

The thickness of the CNT layer 24 can be determined optionally to a desired value in accordance with the application use of the CNT film structure 21. In a case where it is 10 nm or more, it is possible to maintain the integrity as a film and obtain a conductivity required for providing a function as a product used for electronic devices or MEMS devices. While there is no particular restriction for the upper limit value of the film thickness, a range of about from 100 nm to 50 μm is preferred in a case where it is utilized as electronic devices or MEMS devices.

In a case where the CNT layer 24 has the density and the thickness as described above, a three-dimensional circuit or a three-dimensional device of an optional shape can be formed easily, for example, by coating a resist on the CNT layer 24, drawing an optional pattern to the resist by lithography, and etching an unnecessary portion of the CNT layer 24 by using the resist as a mask. That is, this enables to apply a well-known patterning technique or etching technique and enhance affinity with integrated circuit production processes.

The bridged CNT micro structure means the CNT aggregate in which a CNT layer comprising a plurality of CNTs aligned continuously and having high density and uniform thickness bridges a certain surface and an identical or different surface of an optional substrate at a certain distance. For the alignment of the bridged CNT micro structure, at least a portion of the three-dimensional CNT micro structure present in an identical plane has Herman's Orientation Factor of 0.6 or more and, more preferably, 0.7 or more.

Then, a process for producing the bridged CNT micro structure will be described in detail with reference to FIG. 26.

A silicon substrate with an oxide film of 500 nm thickness was prepared and after subjecting the surface thereof to supersonic cleaning with IPA, exposed to $O_2$ plasmas at 300 W for one min to clean the substrate. After the substrate was cleaned, a resist ZEP-520A was spin coated at 4,700 rpm by using a spin coater and baked at 150° C. for 3 min after the coating. The top face of the pillar was drawn to the resist layer by an electron beam drawing apparatus, and developed with a developer ZED-N50/to form a mask to a portion to form a pillar. After depositing a 100 nm Ni layer to a portion exposed from the mask, that is, a portion to form a top face of the pillar by a sputtering apparatus, the resist was removed by a stripping solution ZDMAC and rinsing was conducted with IPA to obtain a silicon substrate where a portion of the surface is masked with the Ni layer. The surface of the silicon substrate with the Ni layer mask was cleaned by $O_2$ plasmas, and the silicon substrate was etched together with the oxide film in a reactive ion etching apparatus by using the Ni layer pattern as a mask. In this case, each of bisected 4 inch silicon substrates with no oxide film on the surface was arranged on both sides of the silicon substrate with the Ni layer mask, $CHF_3$ at 40 sccm, $SF_6$ at 60 sccm, and $O_2$ at 55 sccm were entered simultaneously into an etching chamber and etching was conducted at a discharge power of 100 W for a processing time of 45 min to obtain a desired pillar structure or a trench structure (for example, a pillar group with a pillar height of 5 μm, at a pillar distance of 4 μm, and with an area at the top face of the pillar of 2 μm×2 μm, and a trench group with the area at the top face of 10 μm×90 μm were prepared). A membrane filter made of PTFE was gripped in an X-shaped tweezers and fabricated such that an area of about 3 mm×1 mm could be formed outside the gripping portion.

CNTs of a thickness appropriate to the experiment (4 μm or 8 μm thickness) is selected from the CNT film group prepared in the placing and densification steps. Only one sheet of the CNT film selected as above was gripped by Mister tweezers under a solid microscope (this is possible in a case where the thickness is 2 μm or more) and was taken out from the substrate (in a case of taking by two or more sheets from the substrate, only one sheet is taken out by two Mister tweezers under the stereomicroscope).

An IPA solution is dropped to the substrate for placement to form a liquid droplet on the surface into which the CNT film is immersed together with Mister tweezers under the observation of a stereomicroscope, and the CNT film is detached from the tweezers and caused to wave in the liquid.

Upon evaporation of IPA, the membrane filter is immersed and moved in the solution under observation by the stereomicroscope to control the placing position and the alignment direction of the CNT film (while the CNT film usually waves when immersed in the solution, it is observed till a state where the solution is evaporated and the film is no more movable to control the change of the placing position and the alignment position along with the evaporation of the solution). When the IPA solution is evaporated to decrease the amount of liquid and the CNT film is no more movable, the drying state on the surface of the CNT film is observed and, when the surface of the CNT becomes visible, it is dried while changing the intensity of the light used for observation from the maximum to the minimum. For sufficiently conducting drying, drying is conducted in vacuum at 180° C. for 10 min before coating of the resist.

Then, a solution formed by diluting a resist PMMA 495 with a liquid diluent to five times on the weight basis was coated, and spin coated at 4,700 rpm for one min, over a hot plate at 180° C. for one min, to form a 80 nm auxiliary resist layer. This suppressed the main resist at the second layer from penetrating into the densified CNT film.

FOX16 was further coated as a main resist at the second layer and spin coated at 4500 rpm for one min to form a 360 nm resist layer.

Then, a predetermined pattern was drawn to the main resist layer by an electron beam drawing apparatus (CABL8000/CRESTEC Inc.), which was developed with an aqueous solution of tetramethyl ammonium hydroxide (2.38% ZTMA-100) to form a FOX16 mask. CNTs were etched together with the resist by using the same conditions as those shown in the following processing step to obtain a desired structure at a desired position.

After processing, it was immersed in a hydrofluoric acid interference solution for 20 sec, then immersed and cleaned twice in pure water for 20 sec, immersed in IPA for 20 sec, and immersed in Remover-PG as a PMMA removing solution for 3 min, or immersed in a solution comprising MIBK:IPA=1:1 as a PMMA developing solution for one min and 30 sec to remove the PMMA layer. Finally, it was immersed in IPA for 3 min without drying (during the mask removing process, a specimen is transferred directly from the solution to the solution so that it is not dried up). After immersion in IPA, it is dried spontaneously.

Then, another process for producing a bridged CNT micro structure will be described in detail.

A silicon substrate with an oxide film of 500 nm thickness was prepared and, after cleaning the surface thereof with IPA by supersonic waves, it was exposed to $O_2$ plasmas at 300 W for one min to clean the substrate. After, on the cleaning of the substrate, a resist ZEP-520A was spin coated at 4,700 rpm by using a spin coater and baked at 50° C. for 3 min after the coating. The top face of a pillar was drawn to the resist layer by an electron beam drawing apparatus and developed with a developer ZED-N50/to form a mask to a portion other than that for forming the pillar. After depositing a 100 nm thickness of Ni layer to a portion exposed from the mask, that is, to a portion as a top face to form the pillar by a sputtering apparatus, the resist was removed by a stripping solution ZDMAC and rinsing was conducted by IPA to obtain a silicon substrate in which a portion of the substrate was masked by the Ni layer.

The surface of the silicon substrate with the Ni layer mask was cleaning by $O_2$ plasmas, and the silicon substrate was etched together with the oxide film by reactive ion etching apparatus using the Ni layer pattern as a mask. In this case, each of bisected 4 inch silicon substrates with no oxide film on the surface was arranged respectively on both sides of the silicon substrate with the Ni layer mask, $CHF_3$ at 40 sccm, $SF_6$ at 60 sccm, and O2 at 55 sccm were entered simultaneously into an etching chamber and etching was conducted at a discharge power of 100 W for a processing time of 45 min to obtain a desired pillar structure or trench structure (for example, a pillar group with a pillar height of 5 μm, a pillar distance of 4 μm, and an area at the top face of the pillar of 2 μm×2 μm, and a trench group with the area at the top face of 10 μm×90 μm were prepared). A membrane filter made of PTFE was gripped in an X-shaped tweezers and fabricated such that an area of about 3 mm×1 mm could be formed to a portion outside the gripping portion. A CNT film of a thickness suitable to the experiment (4 μm or 8 μm thickness) is selected from the CNT film group prepared in the placing and densification steps.

Only one sheet of CNT film selected as described above was gripped by Mister tweezers under a stereomicroscope (this is possible in a case of the thickness of 2 μm or more) and was taken out from the substrate (in a case of taking two or more sheets out of the substrate, only one sheet is taken out by two Mister tweezers under the stereomicroscope).

An IPA solution is dropped to the substrate for placement to form a liquid droplet on the surface into which a CNT film is immersed together with the Mister tweezers under the observation of the stereomicroscope, the CNT film is detached from the tweezers and caused to wave in the liquid.

Upon evaporation of IPA, the membrane filter is immersed and moved in the solution under observation by the stereomicroscope to control the placing position and the alignment direction of the CNT film (While the CNT film usually waves when immersed in the solution, it is observed till a state where the solution is evaporated and the film is no more movable to control the change of the placing position and the alignment position along with the evaporation of the solution).

When the IPA solution is evaporated to decrease the amount of liquid and the CNT film is no more movable, the drying state on the surface is observed and, when the surface of the CNT becomes visible, it is dried while changing the intensity of light used for observation from the maximum to the minimum. For sufficiently conducting drying, drying is conducted in vacuum at 180° C. for 10 min before coating of the resist.

Then, FOX16 was applied, spin coated at 4500 rpm for one min and baked. The process was repeated three times to form a resist layer. Then, a predetermined pattern was drawn to the resist layer by an electron beam drawing apparatus (CABL8000/CRESTEC Inc.), which was developed with an aqueous solution of tetramethyl ammonium hydroxide (2.8% ZTMA-100), to form a mask of FOX16.

Then, the CNTs were etched together with the resist using the same conditions as those in the example for the following fabrication step to obtain a desired structure at a desired position. After processing, it was immersed in a hydrofluoric acid interference solution for 20 sec, then immersed in pure water and cleaned twice for 20 sec, and immersed in IPA for 20 sec, and immersed in Remover-PG as a PMMA removing solution for 3 min or immersed in a solution of MIBK:IPA=1:1 as a PMMA developing solution for one min and 30 sac to remove the PMMA layer. Finally, it was immersed in IPA for 3 min without drying (during the mask removing process, the specimen is transferred directly from the solution to the solution so that it is not dried up). After immersion in IPA, it is dried spontaneously.

Etching for the CNT film used upon production of the CNT micro structure and the bridged CNT micro structure will be described below.

A specimen in which a mask in a shape intended for scraping is placed on carbon nanotubes is loaded in a parallel plate type reactive ion etching apparatus. Etching is conducted by entering $O_2$ at 10 sccm, maintaining the pressure in the chamber at 10 Pa, and at a power of 80 W, for 4 min to 10 min. For removing residues, operation is conducted by entering $O_2$ at 10 sccm and Ar at 10 sccm, keeping the pressure in the chamber at 10 Pa, and at a power of 80 W, for 40 sec to one min. Depending on the case, the procedures described above are repeated twice or three times sequentially. After completion of the process, the specimen is taken out of the vacuum atmosphere.

A specimen in which a mask in a shape intended for scraping is placed on a CNT film is loaded in a parallel plate type reactive ion etching apparatus. Etching is conducted by entering $O_2$ at 10 sccm, maintaining the pressure in the chamber at 10 Pa, and at a power of 80 W, for 7 min. For removing residues, operation is conducted by entering $O_2$ at 10 sccm and Ar at 10 sccm, keeping the pressure in the chamber at 10 Pa, and at a power of 80 W, for 3 min. Depending on the case, the procedures described above are repeated twice or three times sequentially. After completion of the process, the specimen is taken out of the vacuum atmosphere.

Then, referring to another example, a specimen in which a mask in a shape intended for scraping is placed on a CNT film is loaded in a parallel plate type reactive ion etching apparatus. Etching is conducted by entering $O_2$ at 10 sccm, keeping the pressure in the chamber at 10 Pa, and at a power of 80 W, for 4 min to 10 min. For removing residues, operation is conducted by entering $O_2$ at 76 sccm and $CHF_3$ at 4 sccm, keeping the pressure in the chamber at 10 Pa, and at a power of 80 W, for one min. Depending on the case, the procedures described above are repeated twice or three times sequentially. After completion of the process, the specimen is taken out of the vacuum atmosphere.

Referring to a further example, a specimen in which a mask in a shape intended for scraping is placed on a CNT film is loaded in a parallel plate type reactive ion etching apparatus. Etching is conducted by entering $O_2$ at 10 sccm, keeping the pressure in the chamber at 10 Pa, and at a power of 80 W, for 4 min to 10 min. For removing residues, operation is conducted by entering $O_2$ at 76 sccm and $CHF_3$ at 4 sccm, keeping the pressure in the chamber at 10 Pa, and at a power of 80 W, for one min. Depending on the case, the procedures described above are repeated twice or three times sequentially. After completion of the process, the specimen is taken out of the vacuum atmosphere.

A method of obtaining an aligned high density CNT film by peeling the CNT film formed on an optional substrate from the substrate is shown below.

In a CNT film structure according to the invention, a contact portion between the CNT layer and the wafer substrate are integrated and the structure has a sufficient adhesion in usual fabrication process. However, the CNT layer can be peeled from the substrate by dipping the layer into a liquid having compatibility with the CNT as used in the densifying step and further applying an external force.

While the CNT film peeled from the substrate contains the liquid in the inside, the film can be densified again by drying on a plate material made of a fluoro resin.

Specifically, the CNT layer was peeled from the wafer substrate by immersing the CNT film structure obtained by the method of Example 1 in a buffered hydrofluoric acid (4.7% HF, 36.2% $NH_4F$, 59.1% $H_2O$/Morita Chemical Industries Co., Ltd.) and removing the oxide film on the surface of the substrate which is a joining surface of the CNT layer. Then, the CNT layer peeled from the wafer substrate was dried spontaneously on the plate material made of a fluoro resin to obtain an aligned high density CNT film.

DEMONSTRATION EXAMPLE 1

Result of demonstrating the controllability for the film thickness and the weight density before and after the densifying treatment in the densifying step of the invention is shown below. As the experimental conditions for this purpose, for obtaining a desired number of CNT films of a desired thickness, the width of the metal catalyst film served for the chemical vapor deposition step (thickness of the CNT film before densification) was defined as 1 µm for 2 sets, 2 µm for 1 set, 4 µm for 2 sets, and 7.5 µm for 4 sets.

Figure 18:
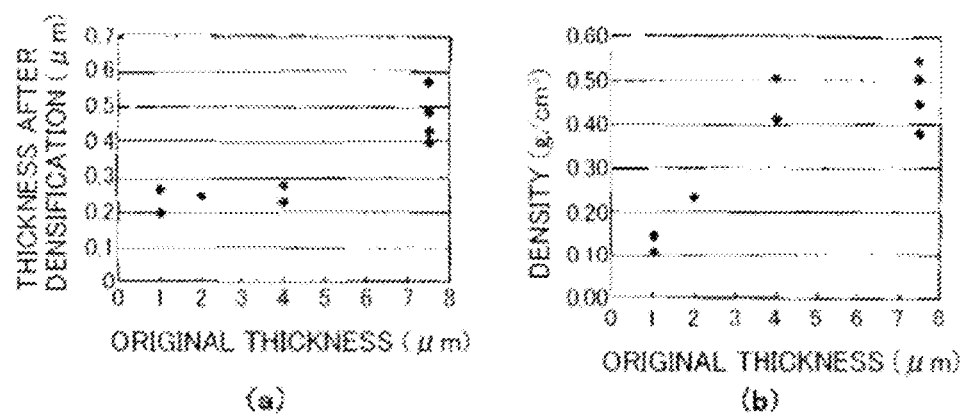

The result is to be described with reference to FIG. 18. As shown in FIG. 18(a), while the CNT film having a thickness before densification (original thickness) of 7.5 µm shrank to about 0.5 µm in average after densification, CNT films having original thickness of 1, 2, 4 µm, shrank to 0.2 µm to 0.3 µm respectively after densification. This suggests that the density is different after densification depending on the original thickness.

On the other hand, since the weight of the CNT film before densification is extremely small, it is difficult to measure the weight density thereof. Then, the weight density of the CNT film before densification was estimated as the density of a bulky CNT aggregate which was grown from a substrate where the metal catalyst film was formed for the entire surface without linear patterning.

While the density of the bulky CNT aggregate is calculated based on weight/volume, it is known that the density of the bulky CNT aggregate is constant under various conditions (refer to Don N. Futabe, et al., 84% Catalyst Activity of Water Assisted Growth of Single Walled Carbon Nanotube Forest Characterization by a Statistical and Macroscopic Approach, Journal of Physical Chemistry B, 2006, vol. 110, p. 8035 to 8038). The reference document reports that the weight density of the bulky CNT aggregate takes a constant value (0.029 $g/cm^3$) in a range of the height of the aggregate from 200 µm to 1 mm. That is, it can be estimated that the density of a CNT film grown by using the growing conditions and the catalyst substantially equal with those in the growth of the bulky CNT aggregate is not greatly different from the density of the bulky CNT aggregate.

When defining the compression ratio of the CNT film (compression ratio=original thickness÷thickness after densification) in the densifying step, the weight density of the CNT film after densification is (CNT density=compression ratio× 0.029 $g/cm^3$). When the weight density of the CNT films of each thickness is derived based on the definition, a relation shown in FIG. 18(b) is obtained. In this demonstration example, the weight density could be controlled from 0.11 $g/cm^3$ to 0.54 $g/cm^3$ by controlling the original thickness of the CNT film.

Also in the CNT film at the weight density of 0.11/$cm^3$ obtained as described above, adhesion with the substrate was kept sufficient and identical patterning with that in each of the examples described above was possible. On the contrary, in a case of a CNT film before densification (weight density 0.029 $g/cm^3$), application of known etching and lithographic techniques was substantially impossible due to insufficient adhesion with the substrate, erosion of the resist, etc.

Figure 19:
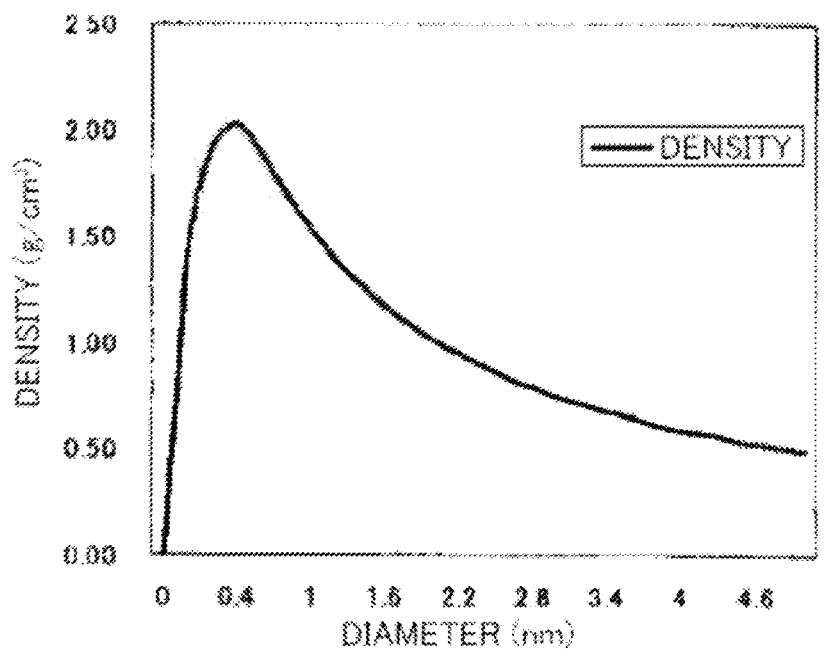
FIG. 19 is a graph showing a relation between a diametrical size and a density after densification of a CNT.

The upper limit for the controllable weight density of the CNT film in the invention is not limited to 0.54 $g/cm^3$ used in this demonstration example. Although not positively described in the present specification, the weight density can be attained, in principle in a wider range by controlling the diameter of CNT. Assuming that all CNTs have an identical diameter and all CNTs are close packed by the densifying step, it can be easily calculated that the CNT density after densification increases as the diametrical size of the CNT is smaller (refer to FIG. 19). While the average diameter of CNTs in the CNT film used in each of the examples described above is about 2.8 nm, the weight density when the CNTs are close packed in this case is about 0.78 $g/cm^3$ as shown in FIG. 19. In this regard, it has been already found that the diameter of the CNT can be made smaller (about 1.0 nm) by using the technique reported in the non-patent document (Ya-Qiong Xu, et al., Vertical Array Growth of Small Diameter Single-Walled Carbon Nanobutes, J. Am. Chem. Soc., 128 (20), 6560 to 6561, 2006). In view of the above, it is considered that the weight density can be increased as far as about 1.5 $g/cm^3$ at the maximum by decreasing the diameter of the CNT.

DEMONSTRATION EXAMPLE 2

The degree of anisotropy, that is, the degree of alignment property can be recognized by measuring the resistivity of a CNT thin film by a 4 terminal method. The 4-terminal method is carried out, for example, as shown in FIG. 20, by placing a CNT thin film 5 on a measuring site in which four Au electrodes 7a to 7d each of 2 µm width are arranged each at 2 µm distance.

Figure 20:
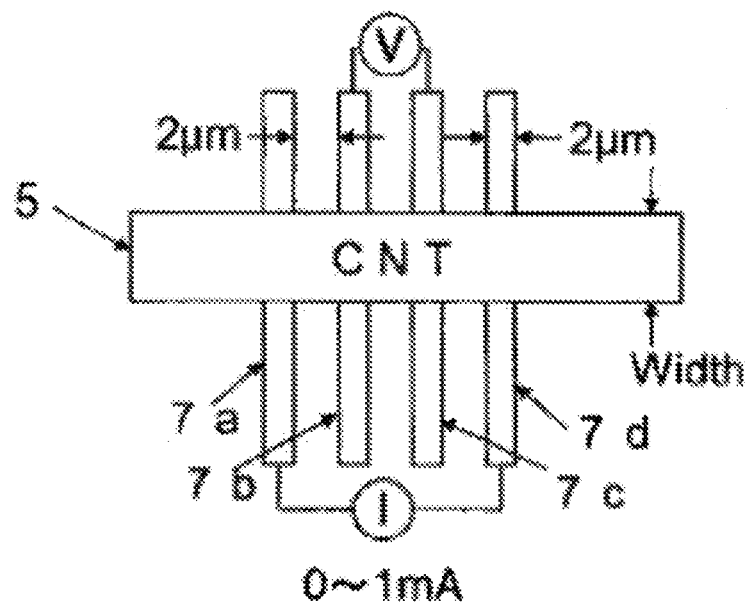
FIG. 20 is a constitutional view conceptually showing a method of measuring the resistivity of a CNT layer.
Figure 21:
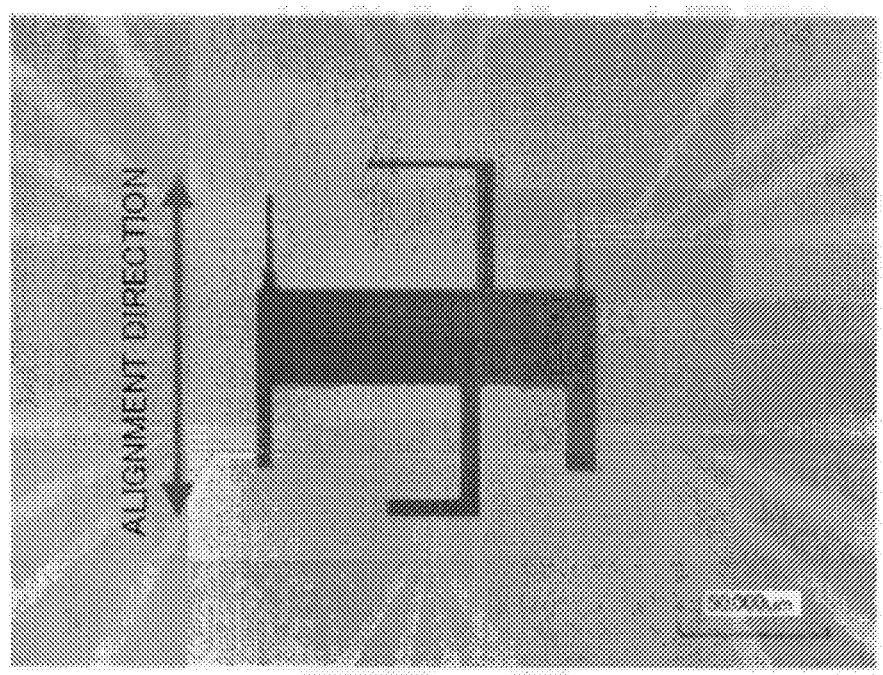
FIG. 21 is a plan view showing the state of placing a patterned CNT layer on a substrate for measuring the resistivity.

The resistivity was measured by the 4-terminal method in this demonstration example, as shown in FIG. 21, by providing a measuring substrate equipped with 6-sets of the measuring sites shown in FIG. 20, and providing CNT thin films each having a thickness of 306 nm, a weight density of 0.28 $g/cm^3$, and an average diameter of 2.8 nm, and CNT thin films each having a thickness of 835 nm, a weight density of 0.19 $g/cm^3$, and an average diameter of 2.8 nm patterned with measuring portions of the lateral size (1, 2, 5, 10 µm for parallel direction, 2.5 µm for perpendicular direction) different from each other for the direction parallel with and the direction perpendicular to the alignment direction of CNTs (shown by an arrow in FIG. 21), and placing the measuring portion formed in each of the CNT thin films on each of the electrodes of the measuring substrate so as to correspond to the electrode for each of the measuring sites.

The surface resistance and the resistivity are calculated according to the following equation:

$$R=(\rho/t)(L/W)=Rs(L/W) \quad \text{(Formula 1)}$$

in which R is resistance (Ω), Rs is surface resistance (Ω/□), ρ is resistivity (Ωcm), L is distance between electrodes to each other, t is thickness of CNT thin film, and W is a width of measuring portion.

Figure 22:
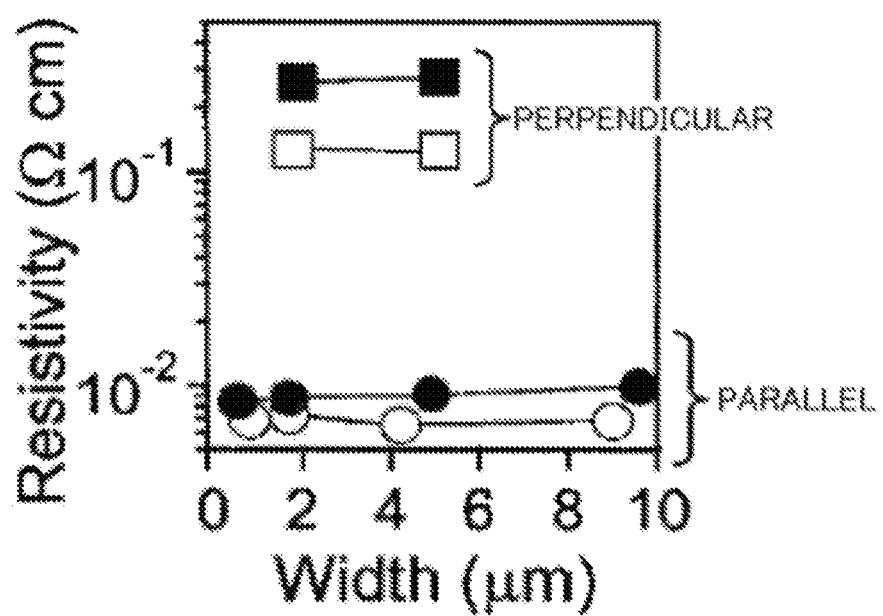
FIG. 22 is a graph showing a relation between the width and the resistivity of a specimen.

As a result, the surface resistance of a CNT thin film of 306 nm thickness was 82 Ω/□ and the surface resistance of a CNT film of 835 nm thickness was 296 Ω/□ and difference due to the width of the measuring portion was within a substantially negligible range. Further, as shown in FIG. 22, the resistivity of a CNT thin film of 306 nm thickness (■, ●) was 0.009 Ωcm for the direction in parallel with the alignment direction and 0.27 Ωcm for the direction perpendicular to the alignment direction, and the resistivity of a CNT thin film of 835 nm thickness (□, ○) was 0.007 Ωcm for the direction in parallel with the alignment direction and 0.13 Ωcm for the direction perpendicular to the alignment direction and, accordingly, anisotropy was confirmed. The ratio between the parallel direction and the perpendicular direction (degree of anisotropy) was 1:30 for the CNT thin film of 306 nm thickness and 1:18 for the CNT thin film of 845 nm thickness.

DEMONSTRATION EXAMPLE 3

For the CNT thin film having a thickness of 450 nm, a weight density of CNT of 0.46 g/cm³, and an average diameter of CNT of 2.8 nm, alignment property was evaluated quantitatively by the Herman's orientation factor.

Figure 23:
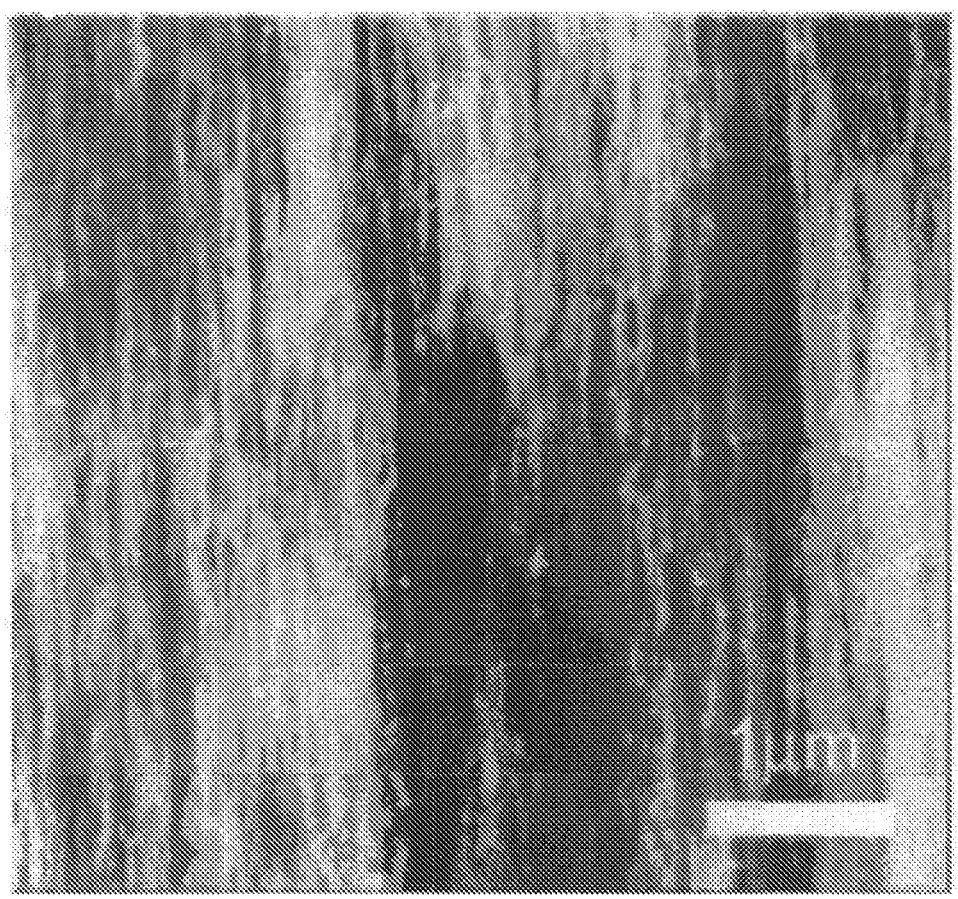
FIG. 23 is an atomic force microscope (AFM) image processed so as to show that the extent of unevenness on the surface of a CNT layer adhered to a planar substrate.
Figure 24:
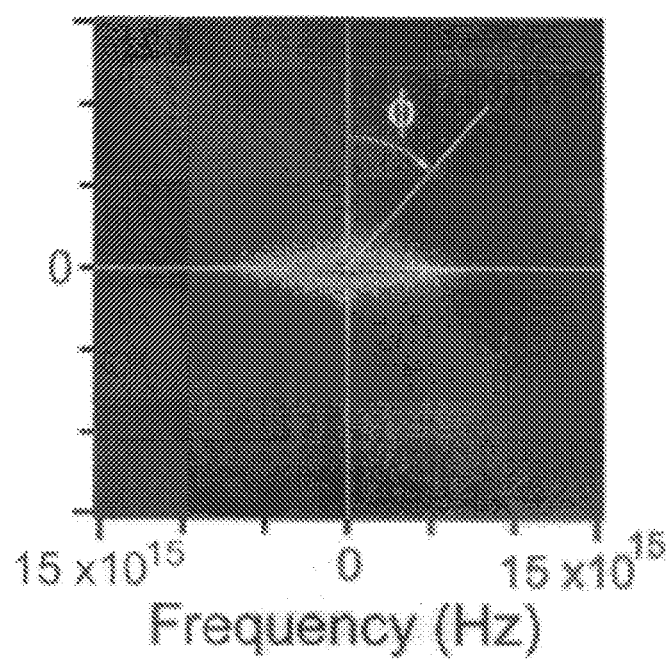
FIG. 24 is a planar image of putting the AFM image in FIG. 23 to Fast Fourier transformation and representing the distribution of unevenness in each direction by a frequency distribution.

FIG. 23 shows an atomic force microscope (AFM) image processed so as to exhibit the degree of unevenness on the surface of a CNT thin film adhered to the planar substrate and FIG. 24 shows a planar image representing the distribution of unevenness in each direction by a frequency distribution by Fast Fourier Transformation (FFT) of the AFM image.

It has been recognized already in FIG. 23 that CNTs extend in the vertical direction and, in FIG. 24 representing the same by a frequency distribution for each of the directions, the profile for the frequency distribution forms a flat elliptic shape with the abscissa being as a major axis. This represents that CNTs are aligned in the vertical direction in FIG. 23. Then, as the ellipsis becomes more flat the alignment property becomes higher. The degree of the alignment property can be quantitatively expressed by Herman's orientation factor (HOF).

HOF is defined according to the following equation.

$$F \equiv \frac{1}{2}(3\langle\cos^2\phi\rangle - 1) \quad \text{[Formula 2]}$$

$$\langle\cos^2\phi\rangle = \frac{\int_0^{\pi/2} I(\phi)\cos^2\phi\sin\phi d\phi}{\int_0^{\pi/2} I(\phi)\sin\phi d\phi}$$

In which ϕ is an angle between the direction along the longitudinal direction and a standard direction of a specimen, and I is an intensity profile obtained from FFT image.

In HOF, for ϕ=0 direction, f=1 in a case of complete alignment and f=−0.5 in a case of complement non-alignment.

As a result, f=0.57 in this example.

For HOF, the following documents can be referred to if necessary.
1. Klug, H. and Alexander, L. E., X-ray Diffraction Procedures, (2nd ed., John Wiley & Sons. Inc., New York, 1974)
2. Lovell, R. and Mitchell, G. R. Acta Crystallogy A37, 135 (1981)

While X-ray diffractometry has been known generally as a method of evaluating the alignment property of fibers, etc., this is calculated based on a relation between the incident angle and a diffraction intensity of X-ray to a specimen and, in a case of a thin film where CNTs are aligned along the plane of the film, measurement for the diffraction intensity to the incidence from a direction parallel with the alignment direction was impossible. According to this demonstration example, since the alignment property is evaluated by using a Fast Fourier Transformation from a plane image by an atomic force microscope (AFM), the alignment property can be evaluated easily also for a thin film of extremely small thickness.

DEMONSTRATION EXAMPLE 4

Transmittance of a CNT thin film was measured by irradiating a light at a wavelength of 640 nm to two CNT thin films of a thickness of 306 nm and 835 nm placed on a transparent glass slide. As a result, they showed values of 61.8% and 16.7% respectively.

The invention claimed is:

1. A carbon nanotube film structure having a carbon nanotube layer comprised of a densified carbon nanotube aggregate in which a plurality of carbon nanotubes align in one direction within a film plane on a substrate so that the adjacent carbon nanotubes are adhered with each other,
    wherein the carbon nanotube layer comprises a weight density of 0.1 g/cm³ to 1.5 g/cm³, a thickness of 10 nm or more, and a Herman's Orientation Factor of 0.6 or more, and
    wherein a direction of shrinkage of the densified carbon nanotube aggregate is defined in one dimensional manner perpendicular to the substrate.

2. The carbon nanotube film structure according to claim 1, wherein the carbon nanotube layer comprises a plurality of laminated carbon nanotube films.

3. A carbon nanotube film having the carbon nanotube layer according to claim 1.

4. A carbon nanotube film having the carbon nanotube layer according to claim 2.

5. A carbon nanotube micro structure, comprising:
    a substrate different from a substrate for forming carbon nanotubes formed with pillars;
    a first carbon nanotube film comprised of a densified carbon nanotube aggregate and placed on the substrate while controlling the position and/or alignment and being patterned; and
    a second carbon nanotube film comprised of a densified carbon nanotube aggregate and placed on the first carbon nanotube film while controlling the position and/or alignment and being patterned,
    wherein the carbon nanotube films comprise a weight density of 0.1 g/cm³ to 1.5 g/cm³, a thickness of 10 nm or more, and a Herman's Orientation Factor of 0.6 or more.

6. A carbon nanotube micro structure, comprising:
    a substrate formed with protrusions or trenches, and
    a carbon nanotube layer comprised of a densified carbon nanotube aggregate in which a plurality of carbon nanotubes align so that the adjacent carbon nanotubes are adhered with each other, wherein the carbon nanotube layer is disposed on the substrate in which the area contacting with height of the protrusion or depth of the trenches,
wherein the interval between the protrusions or the interval between the trenches are covered, and
wherein the carbon nanotube layer comprises a weight density of 0.1 g/cm$^3$ to 1.5 g/cm$^3$, a thickness of 10 nm or more, and a Herman's Orientation Factor of 0.6 or more.

7. The carbon nanotube micro structure according to claim 6, wherein the carbon nanotube layer comprises a plurality of laminated carbon nanotube films.

* * * * *